US012703911B2

(12) United States Patent
Blakeney et al.

(10) Patent No.: US 12,703,911 B2
(45) Date of Patent: Aug. 11, 2026

(54) SUBSTANTIALLY CARBON-FREE MOLYBDENUM-CONTAINING AND TUNGSTEN-CONTAINING FILMS IN SEMICONDUCTOR DEVICE MANUFACTURING

(71) Applicant: Lam Research Corporation, Fremont, CA (US)

(72) Inventors: Kyle Jordan Blakeney, Fremont, CA (US); Chiukin Steven Lai, Sunnyvale, CA (US); Thomas M. Pratt, San Jose, CA (US); Eric H. Lenz, Livermore, CA (US); Jason Stevens, Los Altos, CA (US)

(73) Assignee: Lam Research Corporation, Fremont, CA (US)

( * ) Notice: Subject to any disclaimer, the term of this patent is extended or adjusted under 35 U.S.C. 154(b) by 1214 days.

(21) Appl. No.: 17/753,042

(22) PCT Filed: Aug. 10, 2020

(86) PCT No.: PCT/US2020/070390
§ 371 (c)(1),
(2) Date: Feb. 16, 2022

(87) PCT Pub. No.: WO2021/035236
PCT Pub. Date: Feb. 25, 2021

(65) Prior Publication Data

US 2022/0298624 A1 Sep. 22, 2022

Related U.S. Application Data

(60) Provisional application No. 62/890,456, filed on Aug. 22, 2019.

(51) Int. Cl.
*C23C 16/06* (2006.01)
*C23C 16/30* (2006.01)
(Continued)

(52) U.S. Cl.
CPC ............ *C23C 16/06* (2013.01); *C23C 16/308* (2013.01); *C23C 16/34* (2013.01);
(Continued)

(58) Field of Classification Search
None
See application file for complete search history.

(56) References Cited

U.S. PATENT DOCUMENTS 1,012,671 A 12/1911 Long
5,502,005 A 3/1996 Mikagi
(Continued)

FOREIGN PATENT DOCUMENTS

CN 1332267 A 1/2002
CN 1675402 A 9/2005
(Continued)

OTHER PUBLICATIONS

Anonymous, "Lam Research enables next-generation memory with industry's first ALD process for low-fluorine tungsten fill" Semiconductor Digest News and Industry Trends for Solid State Technology, Aug. 2016, 2 Pages.
(Continued)

*Primary Examiner* — Nishath Yasmeen
(74) *Attorney, Agent, or Firm* — Weaver Austin Villeneuve & Sampson LLP

(57) ABSTRACT

Substantially carbon-free molybdenum-containing and tungsten-containing films are deposited on semiconductor substrates using halide-free metalorganic precursors. The precursors do not include metal-carbon bonds, carbonyl ligands, and, preferably do not include beta-hydrogen atoms. Metal-containing films, such as molybdenum nitride, molybdenum oxynitride, molybdenum silicide, and molybdenum boride with carbon content of less than about 5% atomic, such as less than about 3% atomic are deposited. The
(Continued)

films are deposited in some embodiments by reacting the metal-containing precursor with a reactant on a surface of a substrate in an absence of plasma, e.g. using several ALD cycles. In some embodiments the formed film is then treated with a second reactant in a plasma to modify its properties (e.g., to densify the film, to reduce resistivity of the film, or to increase its work function). The films can be used as liners, diffusion barriers, and as electrode material in pMOS devices.

14 Claims, 13 Drawing Sheets

(51) Int. Cl.
*C23C 16/34* (2006.01)
*C23C 16/455* (2006.01)
*H10D 64/01* (2025.01)
*H10P 14/43* (2026.01)

(52) U.S. Cl.
CPC .. *C23C 16/45553* (2013.01); *C23C 16/45565* (2013.01); *C23C 16/45574* (2013.01); *H10D 64/01316* (2026.01); *H10P 14/43* (2026.01)

(56) References Cited

U.S. PATENT DOCUMENTS 5,612,254 A 3/1997 Mu et al.
5,643,394 A 7/1997 Maydan et al.
5,863,836 A 1/1999 Jones
6,103,609 A 8/2000 Lee et al.
6,271,084 B1 8/2001 Tu et al.
6,284,653 B1 9/2001 Tseng
6,306,216 B1 10/2001 Kim et al.
6,359,160 B1 3/2002 Sun et al.
6,635,965 B1 10/2003 Lee et al.
6,794,287 B2 9/2004 Saanila et al.
6,844,258 B1 1/2005 Fair et al.
6,905,543 B1 6/2005 Fair et al.
6,958,174 B1 10/2005 Klaus et al.
6,979,625 B1 12/2005 Woo et al.
7,005,372 B2 2/2006 Levy et al.
7,141,494 B2 11/2006 Lee et al.
7,250,367 B2 7/2007 Vaartstra et al.
7,262,125 B2 8/2007 Wongsenakhum et al.
7,560,581 B2 7/2009 Gordon et al.
7,589,017 B2 9/2009 Chan et al.
7,691,749 B2 4/2010 Levy et al.
7,772,114 B2 8/2010 Chan et al.
7,955,972 B2 6/2011 Chan et al.
7,993,457 B1 8/2011 Krotov et al.
8,053,365 B2 11/2011 Humayun et al.
8,058,170 B2 11/2011 Chandrashekar et al.
8,089,128 B2 1/2012 Ramaswamy et al.
8,101,521 B1 1/2012 Gao et al.
8,119,527 B1 2/2012 Chadrashekar et al.
8,278,216 B1 10/2012 Alers et al.
9,076,646 B2 7/2015 Sims et al.
9,082,826 B2 7/2015 Chandrashekar et al.
9,159,571 B2 10/2015 Humayun et al.
9,175,023 B2 11/2015 Odedra et al.
9,236,297 B2 1/2016 Chen et al.
9,548,266 B2 1/2017 Ajuria et al.
9,583,385 B2 2/2017 Lee et al.
9,595,470 B2 3/2017 Bamnolker et al.
9,613,818 B2 4/2017 Ba et al.
9,653,353 B2 5/2017 Chandrashekar et al.
9,659,998 B1 5/2017 Lung
9,899,372 B1 2/2018 Bi et al.
9,978,605 B2 5/2018 Bamnolker et al.
10,014,185 B1 7/2018 Wu et al.
10,079,144 B2 9/2018 Kim et al.
10,094,021 B2 10/2018 Lansalot-Matras et al.
10,096,475 B1 10/2018 Shaikh
10,121,671 B2 11/2018 Fu et al.
10,283,404 B2 5/2019 Na et al.
10,395,984 B2 8/2019 Backes et al.
10,505,111 B1 12/2019 Ok et al.
10,510,590 B2 12/2019 Thombare et al.
10,510,951 B1 12/2019 Yu et al.
10,566,211 B2 2/2020 Chandrashekar et al.
10,573,522 B2 2/2020 Jandl et al.
10,622,375 B2 4/2020 Chun et al.
10,643,826 B2 5/2020 Kim et al.
10,643,904 B2 5/2020 Xie et al.
10,731,250 B2 8/2020 Kim et al.
10,734,238 B2 8/2020 Zhou et al.
10,763,108 B2 9/2020 Hausmann et al.
10,777,453 B2 9/2020 Thombare et al.
10,995,405 B2 5/2021 Dezelah et al.
11,211,253 B2 12/2021 Zhou et al.
11,295,980 B2 4/2022 Zope et al.
11,355,345 B2 6/2022 Jandl et al.
11,549,175 B2 1/2023 Butail et al.
11,821,071 B2 11/2023 Blakeney
11,970,776 B2 4/2024 Collins et al.
12,074,029 B2 8/2024 Van Cleemput et al.
12,148,623 B2 11/2024 Van Cleemput et al.
12,327,762 B2 6/2025 Schloss et al.
12,334,351 B2 6/2025 Na et al.
12,351,914 B2 7/2025 Collins et al.
12,362,188 B2 7/2025 Jandl et al.
2001/0002326 A1 5/2001 Yang et al.
2002/0009872 A1 1/2002 Hoshino et al.
2002/0024140 A1 2/2002 Nakajima et al.
2002/0045355 A1 4/2002 Chong et al.
2003/0019428 A1 1/2003 Ku et al.
2003/0082296 A1 5/2003 Elers et al.
2003/0194825 A1 10/2003 Law et al.
2003/0209193 A1 11/2003 Van Wijck
2004/0087143 A1 5/2004 Norman et al.
2004/0202786 A1 10/2004 Wongsenakhum et al.
2005/0031786 A1 2/2005 Lee et al.
2005/0186342 A1 8/2005 Sager et al.
2005/0212139 A1 9/2005 Leinikka et al.
2005/0277296 A1 12/2005 Adetutu et al.
2005/0282384 A1 12/2005 Nawafune et al.
2006/0040052 A1 2/2006 Fang et al.
2006/0046521 A1 3/2006 Vaartstra et al.
2006/0102950 A1 5/2006 Takebuchi et al.
2007/0009658 A1 1/2007 Yoo et al.
2007/0066060 A1 3/2007 Wang
2007/0077712 A1 4/2007 Joo et al.
2007/0190780 A1 8/2007 Chung et al.
2007/0215852 A1 9/2007 Lung
2007/0232015 A1 10/2007 Liu
2008/0014352 A1 1/2008 Xi et al.
2008/0061282 A1 3/2008 Sato et al.
2008/0116437 A1 5/2008 Oh et al.
2008/0124926 A1 5/2008 Chan et al.
2008/0170984 A1 7/2008 Tenne et al.
2008/0197335 A1 8/2008 Yu
2008/0206987 A1 8/2008 Gelatos et al.
2008/0227291 A1 9/2008 Lai et al.
2008/0254623 A1 10/2008 Chan et al.
2008/0268642 A1 10/2008 Yanagita et al.
2008/0274617 A1 11/2008 Milligan
2008/0280390 A1 11/2008 Kim et al.
2008/0303014 A1 12/2008 Goux et al.
2008/0317972 A1 12/2008 Hendriks et al.
2009/0004848 A1 1/2009 Kim et al.
2009/0053893 A1 2/2009 Khandelwal et al.
2009/0081374 A1 3/2009 Yang et al.
2009/0149022 A1 6/2009 Chan et al.
2009/0212280 A1 8/2009 Werner et al.
2009/0239368 A1* 9/2009 Park .................. H10D 64/0134
257/E21.409
2009/0304914 A1 12/2009 Nalla et al.
2010/0107927 A1 5/2010 Stewart et al.
2010/0159694 A1 6/2010 Chandrashekar et al.
2010/0167527 A1 7/2010 Wu et al.
2010/0168404 A1 7/2010 Girolami et al.

(56) References Cited

U.S. PATENT DOCUMENTS

2010/0176512 A1 7/2010 Yang et al.
2010/0207245 A1 8/2010 Cheng et al.
2010/0213541 A1 8/2010 Jeon et al.
2010/0227473 A1 9/2010 Matsuda et al.
2010/0320607 A1 12/2010 Suzuki
2011/0020546 A1 1/2011 Hamalainen et al.
2011/0021024 A1 1/2011 Calvo-Munoz et al.
2011/0146568 A1 6/2011 Haukka et al.
2011/0151615 A1 6/2011 Gordon et al.
2011/0155993 A1 6/2011 Chen
2011/0223763 A1 9/2011 Chan et al.
2011/0256645 A1 10/2011 Tam et al.
2011/0256726 A1 10/2011 Lavoie et al.
2011/0287184 A1 11/2011 Shenai-Khatkhate et al.
2012/0045589 A1 2/2012 Ivanov et al.
2012/0119177 A1 5/2012 Erbetta
2012/0187305 A1 7/2012 Elam et al.
2012/0231626 A1 9/2012 Lee et al.
2012/0305872 A1 12/2012 Yoon
2013/0109172 A1 5/2013 Collins et al.
2013/0164928 A1 6/2013 Lim et al.
2013/0189837 A1 7/2013 Haukka et al.
2013/0270703 A1 10/2013 Zierath et al.
2013/0302980 A1 11/2013 Chandrashekar et al.
2014/0106083 A1 4/2014 Wu et al.
2014/0119977 A1 5/2014 Gatineau et al.
2014/0138604 A1 5/2014 Liu et al.
2014/0147589 A1 5/2014 Khandelwal et al.
2014/0217590 A1 8/2014 Nalla et al.
2014/0284801 A1 9/2014 Kitamura et al.
2014/0370192 A1 12/2014 Odedra et al.
2015/0170961 A1 6/2015 Romero et al.
2015/0179461 A1 6/2015 Bamnolker et al.
2015/0262939 A1 9/2015 Sakata
2015/0325475 A1 11/2015 Bamnolker et al.
2015/0348840 A1 12/2015 Bamnolker et al.
2015/0354064 A1 12/2015 Kolics et al.
2016/0027614 A1 1/2016 Manna et al.
2016/0040289 A1 2/2016 Gatineau et al.
2016/0056074 A1 2/2016 Na et al.
2016/0064409 A1 3/2016 Yaegashi
2016/0077435 A1 3/2016 Ban et al.
2016/0104624 A1 4/2016 Fu et al.
2016/0109800 A1* 4/2016 Bae .................... G03F 7/0382
430/325
2016/0118345 A1 4/2016 Chen et al.
2016/0141419 A1 5/2016 Baenninger et al.
2016/0168699 A1 6/2016 Fukazawa et al.
2016/0172211 A1 6/2016 Demos et al.
2016/0181149 A1 6/2016 Deng
2016/0181272 A1 6/2016 Rabkin et al.
2016/0225632 A1 8/2016 Shaikh et al.
2016/0233220 A1 8/2016 Danek et al.
2016/0300952 A1 10/2016 Toriumi et al.
2016/0309596 A1 10/2016 Shaviv et al.
2016/0343612 A1 11/2016 Wang et al.
2016/0351401 A1 12/2016 Ba et al.
2016/0351444 A1 12/2016 Schloss et al.
2017/0016113 A1 1/2017 Thompson et al.
2017/0040214 A1 2/2017 Lai et al.
2017/0062224 A1 3/2017 Fu et al.
2017/0062714 A1 3/2017 Kau
2017/0069527 A1 3/2017 Haukka et al.
2017/0117155 A1 4/2017 Bamnolker et al.
2017/0125548 A1 5/2017 Hung et al.
2017/0170026 A1 6/2017 Hudson et al.
2017/0178899 A1 6/2017 Kabansky et al.
2017/0213901 A1 7/2017 Ho et al.
2017/0229341 A1 8/2017 Chang et al.
2017/0268107 A1* 9/2017 Lansalot-Matras ........................
C23C 16/45553
2017/0294381 A1 10/2017 Briggs et al.
2017/0306479 A1 10/2017 Raisanen et al.
2017/0306490 A1 10/2017 Chan et al.
2017/0350008 A1 12/2017 Collins et al.
2017/0358482 A1 12/2017 Chen et al.
2018/0019165 A1 1/2018 Baum et al.
2018/0053660 A1 2/2018 Jandl et al.
2018/0142345 A1 5/2018 Meng et al.
2018/0151497 A1 5/2018 Makala et al.
2018/0166276 A1 6/2018 Nakao et al.
2018/0218902 A1 8/2018 Venkatasubramania et al.
2018/0240675 A1 8/2018 Bamnolker et al.
2018/0240676 A1 8/2018 Chan et al.
2018/0247832 A1 8/2018 Fischer et al.
2018/0261503 A1 9/2018 Meng et al.
2018/0286668 A1 10/2018 Baum et al.
2018/0294187 A1 10/2018 Thombare et al.
2018/0312966 A1 11/2018 Chan et al.
2018/0342390 A1 11/2018 Xiao et al.
2018/0347041 A1 12/2018 Kim et al.
2018/0355484 A1 12/2018 Lansalot-Matras et al.
2019/0003050 A1 1/2019 Dezelah et al.
2019/0006226 A1 1/2019 Khare et al.
2019/0019725 A1 1/2019 Chandrashekar et al.
2019/0027573 A1 1/2019 Zhu et al.
2019/0035735 A1 1/2019 Fitzsimmons et al.
2019/0067003 A1 2/2019 Zope et al.
2019/0067014 A1 2/2019 Shrestha et al.
2019/0067094 A1 2/2019 Zope et al.
2019/0067095 A1 2/2019 Zhu et al.
2019/0088474 A1 3/2019 Macdonald et al.
2019/0088555 A1 3/2019 Xie et al.
2019/0157102 A1 5/2019 Jian et al.
2019/0157141 A1 5/2019 Liao et al.
2019/0161853 A1 5/2019 Aoyama et al.
2019/0177838 A1 6/2019 Cadot et al.
2019/0189456 A1 6/2019 Mullick et al.
2019/0189688 A1 6/2019 Lille
2019/0226086 A1 7/2019 Wright, Jr. et al.
2019/0256467 A1 8/2019 Anthis et al.
2019/0273019 A1 9/2019 Mullick et al.
2019/0282384 A1 9/2019 Phillips
2019/0368039 A1 12/2019 Arteaga et al.
2019/0371662 A1 12/2019 Chen et al.
2020/0006073 A1 1/2020 Smith et al.
2020/0010954 A1 1/2020 Bhuyan et al.
2020/0075403 A1 3/2020 Thombare et al.
2020/0105515 A1 4/2020 Maes et al.
2020/0111675 A1 4/2020 Takatsuki et al.
2020/0115798 A1 4/2020 Wright, Jr. et al.
2020/0131628 A1 4/2020 Baum et al.
2020/0144066 A1 5/2020 Jandl et al.
2020/0152870 A1 5/2020 Lin et al.
2020/0194670 A1 6/2020 Allegra
2020/0199743 A1 6/2020 Wright, Jr. et al.
2020/0219933 A1 7/2020 Cheng
2020/0242209 A1 7/2020 Bowes et al.
2020/0283894 A1 9/2020 Lehn et al.
2020/0332416 A1 10/2020 Fluit
2020/0343136 A1 10/2020 Yu et al.
2020/0365456 A1 11/2020 Thombare et al.
2020/0402846 A1 12/2020 Collins et al.
2021/0047726 A1 2/2021 Liu et al.
2021/0057223 A1 2/2021 Stevens et al.
2021/0082750 A1 3/2021 Yu et al.
2021/0098532 A1 4/2021 Wu
2021/0123136 A1 4/2021 Kalutarage et al.
2021/0140043 A1 5/2021 Thombare et al.
2021/0151352 A1 5/2021 Zope et al.
2021/0238736 A1 8/2021 Butail et al.
2021/0285102 A1 9/2021 Yoon et al.
2021/0313183 A1 10/2021 Ba et al.
2021/0320034 A1 10/2021 Lei et al.
2021/0348271 A1 11/2021 Mishra et al.
2021/0407809 A1 12/2021 Zope et al.
2022/0013365 A1 1/2022 Van Cleemput et al.
2022/0018017 A1 1/2022 Kim et al.
2022/0037163 A1 2/2022 Yang et al.
2022/0044929 A1 2/2022 Xiao et al.
2022/0139713 A1 5/2022 Färm et al.
2022/0170155 A1* 6/2022 Blakeney .......... C23C 16/45553
2022/0195598 A1 6/2022 Collins et al.
2022/0220136 A1 7/2022 Leoncini et al.

(56) References Cited

U.S. PATENT DOCUMENTS

2022/0220139 A1 7/2022 Leoncini et al.
2022/0220607 A1 7/2022 Leoncini et al.
2022/0223471 A1 7/2022 Thombare et al.
2022/0262640 A1 8/2022 Jandl et al.
2022/0285211 A1 9/2022 Färm et al.
2022/0325410 A1 10/2022 Yoon et al.
2022/0328317 A1 10/2022 Na et al.
2022/0356579 A1 11/2022 Collins et al.
2022/0359211 A1 11/2022 Van Cleemput et al.
2022/0375792 A1 11/2022 Schloss et al.
2022/0389579 A1 12/2022 Thombare et al.
2023/0290680 A1 9/2023 Collins et al.
2023/0298896 A1 9/2023 Veber et al.
2023/0326790 A1 10/2023 Tarafdar et al.
2024/0047269 A1 2/2024 Na et al.
2024/0052486 A1 2/2024 Blakeney
2024/0136192 A1 4/2024 Schloss et al.
2024/0234152 A9 7/2024 Schloss et al.
2024/0271281 A1 8/2024 Collins et al.
2024/0297075 A1 9/2024 Thombare et al.
2024/0401196 A1 12/2024 Thombare et al.
2025/0029840 A1 1/2025 Van Cleemput et al.
2025/0038003 A1 1/2025 Mandia et al.
2025/0069948 A1 2/2025 Mandia et al.
2025/0132157 A1 4/2025 Bhadauriya et al.
2025/0179635 A1 6/2025 Thombare et al.
2025/0183097 A1 6/2025 Lai et al.
2025/0226227 A1 7/2025 Austin et al.
2025/0246434 A1 7/2025 Lee et al.
2025/0259894 A1 8/2025 Griffiths et al.
2025/0285920 A1 9/2025 Schloss et al.
2025/0287675 A1 9/2025 Mahenderkar et al.
2025/0323045 A1 10/2025 Jandl et al.
2025/0323046 A1 10/2025 Na et al.
2025/0382703 A1 12/2025 Fox et al.
2026/0022453 A1 1/2026 Lee et al.

FOREIGN PATENT DOCUMENTS

CN 1957446 A 5/2007
CN 101308794 A 11/2008
CN 101752299 A 6/2010
CN 101207019 B 12/2010
CN 102206387 A 10/2011
CN 102206387 B 4/2014
CN 104272441 A 1/2015
CN 104752339 A 7/2015
CN 105097446 A 11/2015
CN 105280549 A 1/2016
CN 106575626 A 4/2017
CN 107305838 A 10/2017
CN 107710443 A 2/2018
CN 107768304 A 3/2018
CN 107946234 A 4/2018
CN 108597983 A 9/2018
CN 109072424 A 12/2018
CN 109563621 A 4/2019
CN 109661481 A 4/2019
CN 112420488 A 2/2021
EP 1167567 A1 1/2002
EP 1728894 A1 12/2006
EP 1806352 A1 7/2007
JP S595246 A 1/1984
JP H01181516 A 7/1989
JP H02231714 A 9/1990
JP H03131023 A 6/1991
JP H10176273 A 6/1998
JP H11238736 A 8/1999
JP 2001172049 A 6/2001
JP 2001257177 A 9/2001
JP 2001284360 A 10/2001
JP 3302108 B2 7/2002
JP 2002305162 A 10/2002
JP 2003528215 A 9/2003
JP 2005150416 A 6/2005
JP 2006511716 A 4/2006
JP 2007019375 A 1/2007
JP 2007182443 A 7/2007
JP 4125696 B2 7/2008
JP 2008205219 A 9/2008
JP 2008211183 A 9/2008
JP 2011035366 A 2/2011
JP 2012246531 A 12/2012
JP 2014074190 A 4/2014
JP 2014511380 A 5/2014
JP 2014187208 A 10/2014
JP 2015021175 A 2/2015
JP 2016072587 A 5/2016
JP 2016098406 A 5/2016
JP 2016516892 A 6/2016
JP 2016164131 A 9/2016
JP 2017053024 A 3/2017
JP 2017525156 A 8/2017
JP 2018035375 A 3/2018
JP 2019502253 A 1/2019
JP 2019044266 A 3/2019
JP 2019527302 A 9/2019
JP 2019186508 A 10/2019
JP 2019192906 A 10/2019
JP 2020029618 A 2/2020
JP 2020043139 A 3/2020
JP 2020059916 A 4/2020
JP 2020513065 A 4/2020
JP 2020530663 A 10/2020
JP 2021503551 A 2/2021
JP 2021523983 A 9/2021
JP 2021535575 A 12/2021
JP 7485736 B2 5/2024
KR 0138381 B1 6/1998
KR 20030043201 A 6/2003
KR 100477840 B1 6/2005
KR 20050054122 A 6/2005
KR 20070073636 A 7/2007
KR 20100068845 A 6/2010
KR 20100096488 A 9/2010
KR 20110014069 A 2/2011
KR 20110024932 A 3/2011
KR 20140034081 A 3/2014
KR 20150005533 A 1/2015
KR 20150063562 A 6/2015
KR 20150077376 A 7/2015
KR 20150108780 A 9/2015
KR 20150128615 A 11/2015
KR 20160015157 A 2/2016
KR 20160072054 A 6/2016
KR 20160098986 A 8/2016
KR 20170042297 A 4/2017
KR 101745074 B1 6/2017
KR 20170095801 A 8/2017
KR 20170120498 A 10/2017
KR 20180009702 A 1/2018
KR 20180018372 A 2/2018
KR 20180019487 A 2/2018
KR 20180114159 A 10/2018
KR 20180118055 A 10/2018
KR 20190009245 A 1/2019
KR 20190024823 A 3/2019
KR 20190024834 A 3/2019
KR 20190024841 A 3/2019
KR 20190028743 A 3/2019
KR 20190086054 A 7/2019
KR 20190130046 A 11/2019
KR 20200026711 A 3/2020
KR 20200056543 A 5/2020
KR 20200076757 A 6/2020
KR 20200078423 A 7/2020
KR 20200090108 A 7/2020
KR 20200140923 A 12/2020
KR 20210016063 A 2/2021
KR 20210156444 A 12/2021
TW 494531 B 7/2002
TW 201123305 A 7/2011
TW 201542857 A 11/2015
TW 201705490 A 2/2017

(56) References Cited

FOREIGN PATENT DOCUMENTS

| | | | |
|---|---|---|---|
| TW | 201710543 | A | 3/2017 |
| TW | 201718942 | A | 6/2017 |
| TW | 201738405 | A | 11/2017 |
| TW | 201741325 | A | 12/2017 |
| TW | 201812069 | A | 4/2018 |
| TW | 201812070 | A | 4/2018 |
| TW | 201903847 | A | 1/2019 |
| TW | 201907037 | A | 2/2019 |
| TW | 201911378 | A | 3/2019 |
| TW | 201920736 | A | 6/2019 |
| TW | 201920740 | A | 6/2019 |
| TW | 202020203 | A | 6/2020 |
| TW | 202030861 | A | 8/2020 |
| TW | 202039911 | A | 11/2020 |
| WO | WO-2006036865 | A2 | 4/2006 |
| WO | WO-2007005088 | A2 | 1/2007 |
| WO | WO-2012047591 | A1 | 4/2012 |
| WO | WO-2014052642 | A1 | 4/2014 |
| WO | WO-2015023404 | A1 | 2/2015 |
| WO | WO-2016191432 | A1 | 12/2016 |
| WO | WO-2017070634 | A1 | 4/2017 |
| WO | WO-2017091571 | A1 | 6/2017 |
| WO | WO-2017143246 | A1 | 8/2017 |
| WO | WO-2018191183 | A1 | 10/2018 |
| WO | WO-2019036214 | A1 | 2/2019 |
| WO | WO-2019099233 | A1 | 5/2019 |
| WO | WO-2019118684 | A1 | 6/2019 |
| WO | WO-2019232344 | A1 | 12/2019 |
| WO | WO-2020023790 | A1 | 1/2020 |
| WO | WO-2020028587 | A1 | 2/2020 |
| WO | WO-2020101336 | A1 | 5/2020 |
| WO | WO-2020106649 | A1 | 5/2020 |
| WO | WO-2020159882 | A1 | 8/2020 |
| WO | WO-2020185618 | A1 | 9/2020 |
| WO | WO-2021028587 | A1 | 2/2021 |
| WO | WO-2021035236 | A1 | 2/2021 |
| WO | WO-2021046058 | A1 | 3/2021 |
| WO | WO-2021076636 | A1 | 4/2021 |
| WO | WO-2021178399 | A1 | 9/2021 |
| WO | WO-2021237032 | A1 | 11/2021 |
| WO | WO-2022108762 | A1 | 5/2022 |
| WO | WO-2022150270 | A1 | 7/2022 |
| WO | WO-2022221210 | A1 | 10/2022 |
| WO | WO-2023114648 | A1 | 6/2023 |

OTHER PUBLICATIONS

Chinese First Office Action dated Jan. 4, 2021 issued in Application No. CN 201710700258.6.

Chinese Second Office Action dated Jun. 17, 2021 issued in Application No. CN 201710700258.6.

Chiu, H. et al., "Deposition of Molybdenum Carbonitride Thin Films from $Mo(NBu^t)_2(NHBu^t)_2$", J. Mater. Res, Jul. 1994, vol. 9, No. 7, pp. 1622-1624.

Co-pending U.S. Appl. No. 17/763,529, filed Mar. 24, 2022.

Coventor Brochure "3D NAND: Challenges Beyond 96-Layer Memory Arrays", Oct. 12, 2018, pp. 1-4.

Dominique, S. et al., "An alternative to Tungsten in 3D-NAND technology", IEEE International Interconnect Technology Conference (IITC), 2021, pp. 1-3.

Final Office Action dated May 23, 2019 issued in U.S. Appl. No. 15/948,143.

Final Office Action dated Sep. 2, 2021 issued in U.S. Appl. No. 16/947,286.

International Preliminary Report on Patentability dated Mar. 10, 2022, in Application No. PCT/US2020/070434.

International Preliminary Report on Patentability dated Mar. 3, 2022, in Application No. PCT/US2020/070390.

International Search Report and Written Opinion dated Feb. 3, 2021, in Application No. PCT/US2020/055596.

International Search Report and Written Opinion dated Jun. 9, 2022 in International Application No. PCT/US2022/017005.

International Search Report and Written Opinion dated Sep. 7, 2022 in Application No. PCT/US2022/028845.

International Preliminary Report on Patentability dated Apr. 28, 2022, in PCT Application No. PCT/US2020/055596.

International Preliminary Report on Patentability dated Aug. 12, 2021, issued in Application No. PCT/US2020/015241.

International Preliminary Report on Patentability dated Feb. 4, 2021 in Application No. PCT/US2019/043514.

International Preliminary Report on Patentability dated Jun. 3, 2021 in Application No. PCT/US2019/062067.

International Preliminary Report on Patentability dated Jun. 4, 2020 in Application No. PCT/US2018/061803.

International Preliminary Report on Patentability dated Mar. 17, 2022 in PCT Application No. PCT/US2020/048951.

International Preliminary Report on Patentability dated Nov. 12, 2020 in Application No. PCT/US2019/030712.

International Preliminary Report on Patentability dated Oct. 24, 2019 in Application No. PCT/US2018/026746.

International Preliminary Report on Patentability dated Sep. 23, 2021 issued in Application No. PCT/US2020/021543.

International Search Report and Written Opinion dated Aug. 19, 2019 in Application No. PCT/US2019/030712.

International Search Report and Written Opinion dated Dec. 4, 2020, in PCT Application No. PCT/US2020/048951.

International Search Report and Written Opinion dated Feb. 4, 2021, in PCT Application No. PCT/US2020/070390.

International Search Report and Written Opinion dated Jul. 1, 2020 in Application No. PCT/US2020/021543.

International Search Report and Written Opinion dated Jul. 27, 2018 in Application No. PCT/US2018/026746.

International Search Report and Written Opinion dated Jun. 3, 2020, issued in Application No. PCT/US2020/015241.

International Search Report and Written Opinion dated Mar. 8, 2019 in Application No. PCT/US2018/061803.

International Search Report and Written Opinion dated Mar. 9, 2020 in Application No. PCT/US2019/062067.

International Search Report and Written Opinion dated Nov. 11, 2019 in Application No. PCT/US2019/043514.

International Search Report and Written Opinion dated Nov. 11, 2020 issued in Application No. PCT/US2020/070434.

Jamie, W et al., "In Situ Atomic Layer Deposition and Electron Tunneling Characterization of Monolayer $Al_2O_3$ on Fe for Magnetic Tunnel Junctions", AIP Advances, 2018, vol. 8, No. 125218, pp. 1-9.

Johnson, R.W., Hultqvist, A., Bent, S.F., "A brief review of atomic layer deposition: from fundamentals to applications", Materials today, (Jun. 1, 2014), 17(5):236-46.

JP Office Action dated Apr. 19, 2022 in Application No. JP20200504286 with English translation.

Kim, K. et al., "Simulation of Residual Stress and Its Impact on a Poly-Silicon Channel for Three-Dimensional, Stacked, Vertical-NAND Flash Memories", Journal of the Korean Physical Society, 2017, vol. 70 (12), pp. 1041-1048.

KR Office Action dated Feb. 21, 2022, in Application No. KR10-2017-0102113 with English Translation.

KR Office Action dated May 30, 2022, in Application No. KR10-2019-7033130 With English Translation.

Kurek, A. et al., "Recent Advances Using Guanidinate Ligands for Chemical Vapour Deposition (CVD) and Atomic Layer Deposition (ALD) Applications," Australian Journal of Chemistry, Jun. 2014, vol. 67, pp. 989-996.

Lee, B. et al., "ALD Tungsten Solves Capacity Challenges in 3D Nand Device Manufacturing", Lam Brochure, Jan. 2019, pp. 1-4.

Li, Z. et al., "Atomic Layer Deposition of Ultrathin Copper Metal Films from a Liquid Copper(I) Amidinate Precursor", Journal of The Electrochemical Society, 2006, vol. 153, No. 11, pp. C787-C794.

Lim, B. et al., "Atomic Layer Deposition of Transition Metals", Nature Materials, 2003, vol. 2, pp. 749-754.

Lin, S. et al., "Effect of Nitrogen on the Physical Properties and work Function of MoNx Cap Layers on $HfO_2$ Gate Dielectrics", ECS Journal of Solid State Science and Technology, 2014, vol. 3, No. 12, pp. N161-N165.

(56) References Cited

OTHER PUBLICATIONS

Majumder et al. "Investigation on the diffusion barrier properties of sputtered Mo/W—N thin films in Cu interconnects," Applied Physics Letters, vol. 91 (2007), pp. 162108-1-162108-3.
Miikkulainen, V. et al., "Atomic Layer Deposition of Molybdenum Nitride from Bis(tert-butylimido)-bis(dimethylamido)molybdenum and Ammonia onto Several Types of Substrate Materials with Equal Growth per Cycle", Chemistry of Materials, 2007, vol. 19, pp. 263-269.
Miikkulainen, V. et al., "Bis(tert-butylimido)-bis(dialkylamido) Complexes of Molybdenum as Atomic Layer Deposition (ALD) Precursors for Molybdenum Nitride: the Effect of the Alkyl Group", Chemical Vapor Deposition, 2008, vol. 14, pp. 71-77.
Mohimi, E, et al., "Low temperature chemical vapor deposition of superconducting molybdenum carbonitride thin films", Journal of Vacuum Science & Technology A , 2019, vol. 37, No. 2, 021503, 6 pages.
Nandi, D.K. et al., "Atomic Layer Deposited Molybdenum Nitride Thin Film: A Promising Anode Material for Li Ion Batteries", ACS Applied Material Interfaces, 2014, vol. 6, pp. 6606-6615.
Notice of Allowance dated Apr. 27, 2020 issued in U.S. Appl. No. 16/676,169.
Notice of Allowance dated Aug. 6, 2019 issued in U.S. Appl. No. 15/948,143.
Office Action dated Apr. 27, 2021 issued in U.S. Appl. No. 16/947,286.
Office Action dated Aug. 12, 2021 issued in U.S. Appl. No. 16/764,812.
Office Action dated Feb. 4, 2019 issued in U.S. Appl. No. 15/948,143.
Office Action Requirement for Restriction/Election dated Sep. 22, 2021 issued in U.S. Appl. No. 17/250,452.
Otsuka, S. et al., "A Novel Molybdenum Thiolato Compound, Tetrakis(tert-butylthiolato) molybdenum(IV). Preparation and Crystal and Molecular Structure" Journal of American chemistry society, 1981, vol. 103, pp. 3011-3014.
Ranade, P. et al., "Work Function Engineering of Molybdenum Gate Electrodes by Nitrogen Implantation", Electrochemical and Solid-State Letters, 2001, vol. 4, No. 11, pp. G85-G87.
Shimizu, H. et al., "Precursor-based designs of nano-structures and their processing for Co(W) alloy films as a single layered barrier/liner layer in future Cu-interconnect", Journal of Materials Chemistry C, 2015, vol. 3, pp. 2500-2510.
Specification of U.S. Appl. No. 62/425,704 (Electronically filed Nov. 23, 2016).
TW Office Action dated Aug. 16, 2022, in Application No. TW107141042 with English translation.
TW Office Action dated May 24, 2022, in Application No. TW20180112210 with English translation.
TW Office Action dated Oct. 18, 2021, in application No. TW107112210 with English translation.
TW Office Action dated Sep. 14, 2022, in Application No. TW107112210 with English translation.
U.S Advisory Action dated May 3, 2022 in U.S. Appl. No. 16/764,812.
U.S. Corrected Notice of Allowance dated Feb. 16, 2022, in U.S. Appl. No. 16/724,231.
U.S. Corrected Notice of Allowance dated May 11, 2022, in U.S. Appl. No. 16/724,231.
U.S. Final office Action dated Jul. 25, 2022 in U.S. Appl. No. 17/250,452.
U.S. Final Office Action dated Jan. 31, 2022 in U.S. Appl. No. 16/764,812.
US Final Office Action dated Mar. 29, 2021 issued in U.S. Appl. No. 16/724,231.
U.S. Non Final Office Action dated Mar. 21, 2022, in U.S. Appl. No. 17/250,452.
U.S. Non-Final Office Action dated Dec. 15, 2021 in U.S. Appl. No. 17/250,014.
U.S. Non-Final Office Action dated Jun. 24, 2022, in U.S. Appl. No. 17/436,944 [LAMRP452US].
U.S. Non-Final Office Action dated May 16, 2022 in U.S. Appl. No. 16/764,812.
U.S. Non-Final Office Action dated Nov. 19, 2021, in U.S. Appl. No. 17/250,452.
U.S. Notice of Allowance dated Feb. 2, 2022 in U.S. Appl. No. 16/724,231.
U.S. Notice of Allowance dated Jun. 7, 2022 in U.S. Appl. No. 17/250,014.
U.S. Notice of Allowance dated Sep. 16, 2022 in U.S. Appl. No. 17/250,014.
US Notice of allowance dated Sep. 29, 2021 issued in U.S. Appl. No. 16/724,231.
US Office Action dated Sep. 22, 2020 issued in U.S. Appl. No. 16/724,231.
US Office Action Restriction/Election dated Sep. 9, 2021 issued in U.S. Appl. No. 17/250,014 .
U.S. Appl. No. 17/639,846, inventors Na Jeong-Seok et al., filed Mar. 2, 2022.
U.S. Appl. No. 17/814,206, inventors Collins et al., filed Jul. 21, 2022.
U.S. Appl. No. 17/814,207, inventors Thombare et al., filed Jul. 21, 2022.
U.S. Appl. No. 17/814,209, inventors Cleemput et al., filed Jul. 21, 2022.
Barry, S.T., "Amidinates, Guanidinates and Iminopyrrolidinates: Understanding Precursor Thermolysis to Design a Better Ligand," Coordination Chemistry Reviews, Dec. 2013, vol. 257(23-24), pp. 3192-3201.
Barry, S.T., et al., "The Chemistry of Inorganic Precursors during the Chemical Deposition of Films on Solid Surfaces," Accounts of chemical research, 2018, vol. 51, pp. 800-809.
Becker, J., et al., "Diffusion Barrier Properties of Tungsten Nitride Films Grown by Atomic Layer Deposition From bis(tert-butylimido) bis(dimethylamido)tungsten and ammonia," Applied Physics Letters, 2003, vol. 82 (14), pp. 2239-2241.
CAS Registry No. 500120-09-2, CAS SciFinder, 2025, 2 Pages.
CAS Registry No. 749862-34-8, CAS SciFinder, 2025, 2 Pages.
CN Office Action dated Dec. 28, 2023 in CN Application No. 202080059499.7 with English Translation.
CN Office Action dated Feb. 20, 2025 in CN Application No. 201980038600.8, with English Translation.
CN Office Action dated Feb. 20, 2025 in CN Application No. 201980076277.3 with English translation.
CN Office Action dated Feb. 28, 2023 in Application No. 201880038116.0 with English translation.
CN Office Action dated Feb. 28, 2025 in CN Application No. 201980049916.7, with English Translation.
CN Office Action dated Jan. 13, 2023 in CN Application No. CN201980049916.7 with English Translation.
CN Office Action dated Jan. 16, 2023 in Application No. CN202080020646.X with English translation.
CN Office Action dated Jan. 18, 2024 in CN Application No. 202080020646.X with English translation.
CN Office Action dated Jan. 20, 2026 in CN Application No. 202080072306.1, with English Translation.
CN Office Action dated Jan. 21, 2026 in CN Application No. 202080062173.X, with English Translation.
CN Office Action dated Jul. 9, 2024 in CN Application No. 201980049916.7 with English translation.
CN Office Action dated Jun. 7, 2024 in CN Application No. 201880074995.2, with English Translation.
CN Office Action dated Jun. 27, 2024 in CN Application No. 201980076277.3 with English translation.
CN Office Action dated Mar. 6, 2025 in CN Application No. 202080059499.7, with English Translation.
CN Office Action dated May 28, 2025 in CN Application No. 201880074995.2 with English translation.
CN Office Action dated May 28, 2025 in CN Application No. 201980038600.8 with English translation.
CN Office Action dated May 29, 2025 in CN Application No. 202080072306.1, with English Translation.
CN Office Action dated May 30, 2025 in CN Application No. 202080059499.7, with English Translation.
CN Office Action dated May 30, 2025 in CN Application No. 202080062173.X, with English Translation.

(56) References Cited

OTHER PUBLICATIONS

CN Office Action dated May 31, 2024 in CN Application No. 201980038600.8 with English translation.
CN Office Action dated Nov. 29, 2024 in CN Application No. 201880074995.2, with English Translation.
CN Office Action dated Oct. 17, 2024 in CN Application No. 202080059499.7 with English translation.
CN Office Action dated Sep. 24, 2023, in Application No. CN202080020646.X with English translation.
CN Office Action dated Sep. 28, 2023, in application No. CN201980049916.7 with English translation.
Colaianni, M.L., et al., "The Adsorption and Dissociation of Carbon Monoxide on Clean and Oxygen-Modified Mo(110) Surfaces," Journal of the American Chemical Society, 1992, vol. 114(10), pp. 3735-3743.
Cotton, F.A., "Strong Homonuclear Metal-Metal Bonds," Accounts of Chemical Research, 1969, vol. 2 (8), pp. 240-247.
Dezelah IV, C.L., et al., "A Low Valent Metalorganic Precursor for the Growth of Tungsten Nitride Thin Films by Atomic Layer Deposition," Journal of Materials Chemistry, 2007, vol. 17, pp. 1109-1116.
Dezelah IV, C.L., et al., "Atomic Layer Deposition of Tungsten(III) Oxide Thin Films from W2(NMe2)6 and Water: Precursor-Based Control of Oxidation State in the Thin Film Material," Journal of the American Chemical Society, Aug. 2, 2006, vol. 128(30), pp. 9638-9639.
EP Extended European Search report dated Dec. 14, 2023, in Application No. EP20854552.5.
EP Partial Supplementary European Search report dated Sep. 13, 2023, in Application No. EP20854552.5.
Gall D., "Electron Mean Free Path in Elemental Metals," Journal of Applied Physics, Feb. 23, 2016, vol. 119, 6 Pages.
Hartley, F. R., "Elements of Organometallic Chemistry," The Chemical Society, Monographs for Teachers 26, 1974, pp. 58-59 with English translation; 7 pages.
International Preliminary Report on Patentability dated Dec. 1, 2022, in PCT Application No. PCT/US2021/033564.
International Search Report and Written Opinion datedSep. 9, 2021 in Application No. PCT/US2021/033564.
International Preliminary Report on Patentability and Written Opinion dated Apr. 24, 2025 in PCT Application No. PCT/US2023/034858.
International Preliminary Report on Patentability and Written Opinion dated Jan. 2, 2025 in PCT Application No. PCT/US2023/069018.
International Preliminary Report on Patentability and Written Opinion dated Jan. 29, 2026 in PCT Application No. PCT/US2024/037234.
International Preliminary Report on Patentability and Written Opinion dated Jun. 27, 2024 in PCT Application No. PCT/US2022/080705.
International Preliminary Report on Patentability and Written Opinion dated Jun. 27, 2024 in PCT Application No. PCT/US2022/080863.
International Preliminary Report on Patentability and Written Opinion dated May 8, 2025 in PCT Application No. PCT/US2023/035873.
International Preliminary Report on Patentability and Written Opinion dated Nov. 14, 2023 in PCT Application No. PCT/US2022/028845.
International Preliminary Report on Patentability and Written Opinion dated Nov. 14, 2024 in PCT Application No. PCT/US2023/019795.
International Preliminary Report on Patentability and Written Opinion dated Oct. 17, 2024 in PCT Application No. PCT/US2023/017635.
International Preliminary Report on Patentability and Written Opinion dated Oct. 23, 2025 in PCT Application No. PCT/US2024/023361.
International Preliminary Report on Patentability and Written Opinion dated Oct. 31, 2024 in PCT Application No. PCT/US2023/019000.
International Preliminary Report on Patentability and Written Opinion dated Sep. 6, 2024 in PCT Application No. PCT/US2023/062877.
International Preliminary Report on Patentability dated Jul. 20, 2023, in PCT Application No. PCT/US2022/011053.
International Preliminary Report on Patentability dated Jun. 1, 2023, in Application No. PCT/US2021/058099.
International Preliminary Report on Patentability dated Oct. 26, 2023, in PCT Application No. PCT/US2022/024295.
International Preliminary Report on Patentability dated Sep. 7, 2023, in PCT Application No. PCT/US2022/017005.
International Preliminary Reporton Patentability and Written Opinion dated Nov. 7, 2024 in PCT Application No. PCT/US2023/019800.
International Search Report and Written Opinion dated Apr. 7, 2023 in PCT Application No. PCT/US2022/080705.
International Search Report and Written Opinion dated Apr. 25, 2022, for International Application No. PCT/US2022/011053.
International Search Report and Written Opinion dated Apr. 27, 2023 in PCT Application No. PCT/US2022/080863.
International Search Report and Written Opinion dated Aug. 2, 2022 in Application No. PCT/US2022/024295.
International Search Report and Written Opinion dated Aug. 11, 2023, in Application No. PCT/US2023/019795.
International Search Report and Written Opinion dated Aug. 16, 2023, in Application No. PCT/US2023/017635.
International Search Report and Written Opinion dated Aug. 16, 2023, in Application No. PCT/US2023/019800.
International Search Report and Written Opinion dated Aug. 16, 2023, in ApplicationNo. PCT/US2023/019000.
International Search Report and Written Opinion dated Feb. 7, 2024 in PCT Application No. PCT/US2023/034858.
International Search Report and Written Opinion dated Feb. 16, 2024 in PCT Application No. PCT/US2023/035873.
International Search Report and Written Opinion dated Jul. 23, 2024 in PCT Application No. PCT/US2024/023361.
International Search Report and Written Opinion dated Jun. 11, 2025 in PCT Application No. PCT/US2025/017720.
International Search Report and Written Opinion dated Jun. 19, 2023, in Application No. PCT/US2023/062877.
International Search Report and Written Opinion dated Mar. 3, 2022, in Application No. PCT/US2021/058099.
International Search Report and Written Opinion dated Oct. 17, 20223 in PCT Application No. PCT/US2023/069018.
International Search Report and Written Opinion dated Oct. 22, 2024 in PCT Application No. PCT/US2024/037234.
Ishihara, S., et al., "MOCVD of Monolayer MoS2 using Novel Molybdenum Precursor i-Pr2DADMo(CO)3," Materials Research Society, 2018, vol. 3, pp. 379-384.
Jang, Y., et al., "Highly-conformal Nanocrystalline Molybdenum Nitride Thin Films by Atomic Layer Deposition as a Diffusion Barrier Against Cu," Journal of Alloys and Compounds, 2016, vol. 663, pp. 651-658.
Jiang P., et al., "Dependence of Crystal Structure and Work Function of WNX Films on the Nitrogen Content," Applied Physics Letters, 2006, vol. 89, (122107) pp. 1-3.
JP Decision to Grant and Search Report dated Jul. 1, 2025 in JP Application No. 2021-527153, with English translation.
JP Notice of Allowances dated Oct. 1, 2024 in JP Application No. 2021-543355 with English translation.
JP Notice of Allowances dated Oct. 15, 2024 in JP Application No. 2021-552861 with English translation.
JP Office Action dated Aug. 6, 2024 in JP Application No. 2023-547183, with English Translation.
JP Office Action dated Aug. 20, 2024 in JP Application No. 2022-514153, with English Translation.
JP Office Action dated Dec. 2, 2025 in JP Application No. 2023-539751, with English Translation.
JP Office Action dated Dec. 12, 2023 in JP Application No. 2021-527153 with English Translation.

(56) References Cited

OTHER PUBLICATIONS

JP Office Action dated Dec. 26, 2023, in application No. JP20220141888 with English translation.
JP Office Action dated Feb. 6, 2024 in JP Application No. 2021-543355 with English translation.
JP Office Action dated Feb. 20, 2024 in JP Application No. 2023-547183 with English translation.
JP Office Action dated Feb. 27, 2024 in Application No. JP2022-522581 with English Translation.
JP Office Action dated Jan. 6, 2026 in JP Application No. 2023568487, with English Translation.
JP Office Action dated Jan. 7, 2025 in JP Application No. 2021-527153 with English translation.
JP Office Action dated Jan. 28, 2025 in JP Application No. 2022-571128, with English Translation.
JP Office Action dated Jul. 8, 2025 in JP Application No. 2022-514153, with English Translation.
JP Office Action dated Jul. 16, 2024 in JP Application No. 2021-527153, with English Translation.
JP Office Action dated Jun. 6, 2023 in Application No. JP2020561743 With English translation.
JP Office Action dated Jun. 11, 2024 in JP Application No. 2023-95239, with English Translation.
JP Office Action dated Jun. 3, 2025 in JP Application No. 2022141888, with English Translation.
JP Office Action dated Jun. 3, 2025 in JP Application No. 2022509591, with English Translation.
JP Office Action dated Mar. 4, 2025 in JP Application No. 2022-514153, with English Translation.
JP Office Action dated Mar. 5, 2024 in JP Application No. 2022-141887, with English Translation.
JP Office Action dated Mar. 19, 2024 in JP Application No. 2020-561743, with English Translation.
JP Office Action dated Mar. 19, 2024 in JP Application No. 2021-552861 with English translation.
JP Office Action dated May 7, 2025 in JP Application No. 2022-141887, with English Translation.
JP Office Action dated Nov. 4, 2025 in JP Application No. 2023-528357, with English Translation.
JP Office Action dated Nov. 12, 2024 in JP Application No. 2022-522581 with English translation.
JP Office Action dated Oct. 3, 2023 in Application No. JP2022-522581 with English Translation.
JP Office Action dated Oct. 3, 2023 in Application No. JP2023-95239 with English Translation.
JP Office Action dated Oct. 29, 2024 in JP Application No. 2022-141887 with English translation.
JP Office Action dated Sep. 2, 2025 in JP Application No. 2020-561743, with English Translation.
JP Office Action dated Sep. 3, 2024 in JP Application No. 2022-141888 with English translation.
JP Office Action dated Sep. 3, 2024 in JP Application No. 2022-509591, with English Translation.
JP Office Action dated Sep. 5, 2023, in Application No. JP2022-145721 with English translation.
JP Office Action dated Sep. 9, 2025 in JP Application No. 2022-571128, with English Translation.
JP Office Action dated Sep. 16, 2025 in JP Application No. 2024-114404, with English Translation.
Juppo, et al., "Deposition of Molybdenum Thin Films by an Alternate Supply of MoCl 5 and Zn," Journal of Vacuum Science and Technology A, vol. 16, Sep./Oct. 1998, doi: 10.1116/1.581430, pp. 2845-2850.
Karunarathne, M.C., et al., "Synthesis, Structural Characterization, and Volatility Evaluation of Zirconium and Hafnium Amidate Complexes," Journal of Organometallic Chemistry, 2017, vol. 847, pp. 204-212.
Kerrigan, M.M., et al., "Low Temperature, Selective Atomic Layer Deposition of Cobalt Metal Films Using Bis(1,4-di-tert-butyl-1,3-diazadienyl)cobalt and Alkylamine Precursors," Chemistry of Materials, 2017, vol. 29(17), pp. 7458-7466.
Kerrigan, M.M., et al., "Low Temperature, Selective Atomic Layer Deposition of Nickel Metal Thin Films," ACS Applied Materials & Interfaces, 2018, vol. 10(16), pp. 14200-14208.
Keyan Z., "Essays on Organic Chemistry: Homogeneous Catalytic Reaction of Unsaturated Hydrocarbons," Higher Education Press, May 1989, vol. 3, p. 11 with English translation; 6 Pages.
Kim, T., et al., "Thermal Chemistry of Cu(I)-Iminopyrrolidinate and Cu(I)-Guanidinate Atomic Layer Deposition (ALD) Precursors on Ni(110) Single-Crystal Surfaces," Chemistry of Materials, 2013, vol. 25, pp. 3630-3639.
Knisley, T.J., et al., "Volatility and High Thermal Stability in Mid to Late First Row Transition Metal Diazadienyl Complexes," Organometallics, 2011, vol. 30(18), pp. 5010-5017.
KR Decision to Grant and Search Report dated Aug. 26, 2025 in KR Application No. 10-2021-7032632, with English translation.
KR Decision to Grant and Search Report dated Dec. 24, 2025 in KR Application No. 10-2022-7011026, with English translation.
KR Decision to Grant and Search Report dated Oct. 24, 2025 in KR Application No. 10-2022-7009362, with English translation.
KR Notice of Allowance dated Feb. 11, 2025 in KR Application No. 10-2020-7034800, with English Translation.
KR Notice of Allowance dated Nov. 25, 2024 in KR Application No. 10-2023-0081299, with English Translation.
KR Notice of Allowances dated Aug. 28, 2024 in KR Application No. 10-2023-7028915 with English Translation.
KR Notice of Allowances dated Jan. 8, 2025 in KR Application No. 10-2022-7031314 with English Translation.
KR Office Action dated Apr. 21, 2025 in KR Application No. 10-2021-7018803, with English Translation.
KR Office Action dated Apr. 22, 2025 in KR Application No. 10-2021-7026960, with English Translation.
KR Office Action dated Aug. 26, 2025 in KR Application No. 10-2021-7005949, with English Translation.
KR Office Action dated Dec. 3, 2024 in KR Application No. 10-2021-7032632 with English Translation.
KR Office Action dated Dec. 15, 2023 in KR Application No. 10-2023-7028915, with English Translation.
KR Office Action dated Dec. 16, 2025 in KR Application No. 10-2022-7044688, with English Translation.
KR Office Action dated Dec. 18, 2025 in KR Application No. 10-2021-7026960, with English Translation.
KR Office Action dated Dec. 20, 2024 in KR Application No. 10-2022-7015736, with English Translation.
KR Office Action dated Dec. 29, 2025 in KR Application No. 10-2020-7017697, with English Translation.
KR Office Action dated Feb. 21, 2025 in KR Application No. 10-2022-7009362, with English Translation.
KR Office Action dated Feb. 26, 2025 in KR Application No. 10-2020-7017697, with English Translation.
KR Office Action dated Jan. 27, 2023 in Application No. KR10-2017-0102113 with English Translation.
KR Office Action dated Jul. 8, 2025 in KR Application No. 10-2022-7045710, with English Translation.
KR Office Action dated Jul. 9, 2025 in KR Application No. 10-2022-7011026, with English Translation.
KR Office Action dated Jul. 17, 2025 in KR Application No. 10-2022-7045707, with English Translation.
KR Office Action dated Jul. 28, 2023, in Application No. KR10-2023-0081299 with English Translation.
KR Office Action dated Jun. 27, 2024 in KR Application No. 10-2023-0081299, with English Translation.
KR Office Action dated Mar. 1, 2024 in KR Application No. 10-2021-7018803, with English Translation.
KR Office Action dated Mar. 29, 2024 in KR Application No. 10-2020-7017697 with English translation.
KR Office Action dated May 7, 2024 in KR Application No. 10-2020-7034800, with English Translation.
KR Office Action dated Nov. 14, 2023, in KR Application No. 10-2022-7031314 with English Translation.
KR Office Action dated Nov. 21, 2024 in KR Application No. 10-2021-7005949 with English Translation.

(56) References Cited

OTHER PUBLICATIONS

KR Office Action dated Oct. 20, 2025 in KR Application No. 10-2022-7044687, with English Translation.
KR Office Action dated Oct. 27, 2022 in Application No. KR10-2022-7026373 with English translation.
KR Office Action dated Oct. 28, 2024 in KR Application No. 10-2021-7018803 with English Translation.
KR Office Action dated Sep. 16, 2025 in KR Application No. 10-2022-7015736, with English Translation.
KR Office Action dated Sep. 23, 2025 in KR Application No. 10-2022-7044028, with English Translation.
KR Office Action dated Sep. 26, 2024 in KR Application No. 10-2022-7031314, with English Translation.
Makela, M., et al., "Thermal Atomic Layer Deposition of Continuous and Highly Conducting Gold Thin Films," Chemistry of Materials, 2017, vol. 29, pp. 6130-6136.
Muhtade, M., et al., "Time Influence on Thickness and Grains for Molybdenum Thin Film," 2017, e-ISSN: 2289-8131, vol. 9, No. 2-13.
Ouyang, T., et al., "A Surface Chemistry Route to Molybdenum Sulfide and Germanide Films Using the Single-Source Precursor Tetrakis(diethylaminodithiocarbomato)molybdate(IV)," The Journal of Physical Chemistry B, 2004, vol. 108(5), pp. 17537-17545.
Pol, V. G., et al., "Fabrication of Magnetic Nanoparticles Using Rapet Technique With or Without Employing External Magnetic Field," The Journal of Physical Chemistry C, 2008, vol. 112, pp. 6627-6637.
Qu Jingxin, et al., "Surface Engineering Handbook," Chemical Industry Publishing House, Mar. 31, 1998, p. 277.
Seghete, D et al., Molybdenum Atomic Layer Deposition Using MoF6 and Si2H6 As the Reactants, Chemistry of Materials, 2011, vol. 23 No. 7, pp. 1668-1678.
SG Office Action dated Oct. 11, 2023, in application No. SG11202201453T.
SG Office Action dated Sep. 19, 2023, in application No. SG11202202087P.
SG Search Report and Written Opinion dated Aug. 22, 2024 in SG Application No. 11202203845Q.
SG Search Report and Written Opinion dated Feb. 10, 2023 in Application No. SG11202109796Q.
SG Written Opinion dated Jan. 9, 2025 in SG Application No. 11202202087P.
SG Written Opinion dated Mar. 4, 2025 in SG Application No. 11202201453T.
SG Written Opinion dated Mar. 28, 2025 in SG Application No. 11202203845.
SG Written Opinion dated Oct. 4, 2023 in Application No. SG11202109796Q.
Shirazi, M., et al., "Initial Stage of Atomic Layer Deposition of 2D-$MoS_2$ on a $SiO_2$ surface: a DFT study," Physical Chemistry Chemical Physics, 2018, vol. 20 (24), pp. 1-18.
Singapore Written Opinion dated Mar. 15, 2023 issued in Application No. SG11202108217U.
Stephenson T A., et al., "487. Molybdenum(II) Carboxylates," Journal of the Chemical Society, 1964, pp. 2538-2541.
Stoffelbach F., et al., "A Bis(Diazadiene) Adduct of MoCl2: Mononuclear, Octahedral, Undistorted and Diamagnetic," European Journal of Inorganic Chemistry, 2004, (4), pp. 726-731.
Stoffelbach F., et al., "Half-Sandwich Molybdenum(III) Compounds Containing Diazadiene Ligands and Their Use in the Controlled Radical Polymerization of Styrene," Journal of Organometallic Chemistry, Dec. 2002, vol. 663 (1-2), pp. 269-276.
Sun Yicai, et al., "Design Manufacturing and Application," Metallurgical Industry Publishing House, Apr. 30, 2000, p. 166.
TW Office Action and Search Report dated Aug. 28, 2025 in TW Application No. 111113974, with English Translation.
TW Office Action and Search Report dated Jul. 2, 2025 in TW Application No. 110142342, with English Translation.
TW Office Action and Search Report dated May 13, 2025 in TW Application No. 111100209, with English Translation.
TW Office Action and Search Report dated Sep. 15, 2025 in TW Application No. 111106158, with English Translation.
TW Office Action dated Apr. 15, 2025 in TW Application No. 110118417, with English Translation.
TW Office Action dated Apr. 24, 2024 in TW Application No. 109130013, With English Translation.
TW Office Action dated Aug. 31, 2023, in Application No. TW109102778 with English translation.
TW Office Action dated Dec. 5, 2023 in TW Application No. 109107661 with English translation.
TW Office Action dated Dec. 21, 2023 in Application No. TW108126326 with English translation.
TW Office Action dated Feb. 4, 2026 in TW Application No. 111117762, with English Translation.
TW Office Action dated Feb. 4, 2026 in TW Application No. 113149595, with English Translation.
TW Office Action dated Feb. 4, 2026 in TW Application No. 114108655, with English Translation.
TW Office Action dated Feb. 5, 2026 in TW Application No. 110142342, with English Translation.
TW Office Action dated Feb. 10, 2023 in Application No. TW107112210 with English translation.
TW Office Action dated May 9, 2024 in TW Application No. 109107661 with English translation.
TW Office Action dated May 22, 2024 in TW Application No. 109135654, with English Translation.
TW Office Action dated Oct. 19, 2023 in Application No. TW107112210 with English translation.
U.S. Corrected Notice of Allowance dated Jan. 9, 2026 in U.S. Appl. No. 18/547,481.
U.S. Corrected Notice of Allowance dated Mar. 6, 2025 in U.S. Appl. No. 17/639,846.
U.S. Final Office Action dated Feb. 2, 2023 in U.S. Appl. No. 17/436,944.
U.S. Final Office Action dated Apr. 12, 2024 in U.S. Appl. No. 17/814,206.
U.S. Final Office Action dated Aug. 29, 2025 in U.S. Appl. No. 18/799,905.
U.S. Final Office Action dated Dec. 9, 2025 in U.S. Appl. No. 17/999,255.
U.S. Final Office Action dated Feb. 4, 2025 in U.S. Appl. No. 18/310,523.
U.S. Final Office Action dated Feb. 12, 2024 in U.S. Appl. No. 17/589,416.
U.S. Final Office Action dated Jan. 3, 2025 in U.S. Appl. No. 17/662,220.
U.S. Final office Action dated Jun. 26, 2023 in U.S. Appl. No. 17/589,416.
U.S. Final Office Action dated Mar. 1, 2023 in U.S. Appl. No. 17/250,452.
U.S. Final Office Action dated May 8, 2024 in U.S. Appl. No. 17/250,452.
U.S. Final Office Action dated May 9, 2024 in U.S. Appl. No. 17/814,207.
U.S. Final Office Action dated May 31, 2023, in U.S. Appl. No. 17/814,207.
U.S. Final Office Action dated Nov. 22, 2024 in U.S. Appl. No. 17/639,846.
U.S. Final Office Action dated Oct. 7, 2025 in U.S. Appl. No. 18/379,397.
U.S. Final Office Action dated Oct. 10, 2024 in U.S. Appl. No. 18/379,397.
U.S. Final Office Action dated Sep. 2, 2025 in U.S. Appl. No. 18/286,994.
U.S. Final office Action dated Sep. 14, 2023 in U.S. Appl. No. 17/662,220.
U.S. Non-Final Office Action dated Apr. 9, 2025 in U.S. Appl. No. 18/286,994.
U.S. Non-Final Office Action dated Aug. 7, 2024 in U.S. Appl. No. 18/310,523.
U.S. Non-Final Office Action dated Aug. 27, 2025 in U.S. Appl. No. 18/253,038.

(56) References Cited

OTHER PUBLICATIONS

U.S. Non-Final Office Action dated Aug. 29, 2023, in U.S. Appl. No. 17/310,293.
U.S. Non-Final Office Action dated Feb. 2, 2023 in U.S. Appl. No. 17/589,416.
U.S. Non-Final Office Action dated Feb. 2, 2023 in U.S. Appl. No. 17/662,220.
U.S. Non-Final Office Action dated Feb. 29, 2024 in U.S. Appl. No. 17/294,378.
U.S. Non-Final Office Action dated Jan. 17, 2024 in U.S. Appl. No. 17/814,207.
U.S. Non-Final Office Action dated Jul. 20, 2023, in U.S. Appl. No. 17/814,209.
U.S. Non-Final Office Action dated Jul. 23, 2025 in U.S. Appl. No. 18/559,783.
U.S. Non-Final Office Action dated Jul. 24, 2024 in U.S. Appl. No. 17/763,529.
US Non-Final Office Action dated Jul. 29, 2025 in U.S. Appl. No. 17/999,255.
U.S. Non-Final Office Action dated Jun. 20, 2023, in U.S. Appl. No. 17/250,452.
U.S. Non-Final Office Action dated Jun. 21, 2024 in U.S. Appl. No. 17/639,846.
U.S. Non-Final Office Action dated Jun. 21, 2024 in U.S. Appl. No. 18/379,397.
U.S. Non-Final Office Action dated Mar. 21, 2025 in U.S. Appl. No. 18/379,397.
US Non-Final Office Action dated May 6, 2025 in U.S. Appl. No. 18/799,905.
U.S. Non-Final Office Action dated May 23, 2024 in U.S. Appl. No. 17/662,220.
U.S. Non-Final Office Action dated May 23, 2025 in U.S. Appl. No. 18/310,523.
U.S. Non-Final Office Action dated Nov. 6, 2023, in U.S. Appl. No. 17/814,206.
U.S. Non-Final Office Action dated Nov. 30, 2023 in U.S. Appl. No. 17/250,452.
U.S. Non-Final Office Action dated Oct. 26, 2023, in U.S. Appl. No. 17/589,416.
U.S. Non-Final Office Action dated Sep. 4, 2025 in U.S. Appl. No. 18/626,278.
U.S. Non-Final Office Action dated Sep. 5, 2024 in U.S. Appl. No. 17/814,206.
U.S. Notice of Allowance dated Apr. 4, 2024 in U.S. Appl. No. 17/310,293.
U.S. Notice of Allowance dated Aug. 3, 2023, in U.S. Appl. No. 17/436,944.
U.S. Notice of Allowance dated Dec. 4, 2025 in U.S. Appl. No. 18/286,994.
U.S. Notice of Allowance dated Dec. 12, 2025 in U.S. Appl. No. 18/547,481.
U.S. Notice of Allowance dated Feb. 11, 2025 in U.S. Appl. No. 17/763,529.
U.S. Notice of Allowance dated Feb. 21, 2025 in U.S. Appl. No. 17/763,529.
U.S. Notice of Allowance dated Feb. 26, 2025 in U.S. Appl. No. 17/639,846.
U.S. Notice of Allowance dated Jan. 2, 2024 in U.S. Appl. No. 17/310,293.
U.S. Notice of Allowance dated Jul. 3, 2024 in U.S. Appl. No. 17/294,378.
U.S. Notice of Allowance dated Jul. 14, 2023 in U.S. Appl. No. 17/436,944.
U.S. Notice of Allowance dated Mar. 5, 2025 in U.S. Appl. No. 17/814,206.
U.S. Notice of Allowance dated Mar. 21, 2025 in U.S. Appl. No. 17/662,220.
U.S. Notice of Allowance dated Mar. 27, 2024 in U.S. Appl. No. 17/814,209.
U.S. Notice of Allowance dated Nov. 14, 2023 in U.S. Appl. No. 17/814,209.
U.S. Notice of Allowance dated Nov. 18, 2025 in U.S. Appl. No. 18/559,783.
U.S. Notice of Allowance dated Oct. 4, 2023, in U.S. Appl. No. 17/436,944.
U.S. Appl. No. 18/837,560, inventors Hsieh Y, et al., filed Aug. 9, 2024.
U.S. Appl. No. 19/119,205, inventors Mandia D.J. et al., filed Apr. 8, 2025.
U.S. Appl. No. 19/413,563, inventors Thombare S.V et al., filed Dec. 9, 2025.
U.S. Appl. No. 19/473,869, inventors Mandia D.J et al., filed Oct. 9, 2025.
U.S. Appl. No. 19/500,039, inventors Mandia D.J et al., filed Jan. 7, 2026.
U.S. Appl. No. 62/362,582, inventors Meng et al., filed Jul. 14, 2016.
U.S. Restriction Requirement dated Apr. 10, 2025 in U.S. Appl. No. 17/999,255.
U.S. Restriction requirement dated Dec. 23, 2025, in U.S. Appl. No. 18/837,560.
U.S. Restriction Requirement dated Jun. 13, 2025 in U.S. Appl. No. 18/626,278.
Werndrup P., et al., A Single-source-precursor Approach to Late Transition Metal Molybdate Materials: the Structural Role of Chelating Ligands in the Formation of Heterometallic Heteroleptic Alkoxide Complexes, European Journal of Inorganic Chemistry, 2006, vol. 2006 (7), 1413-1422.
Zhao, Y., et al., "Synthesis and Structures of Mono- and Dinuclear Molybdenum Complexes with Reduced a-Diimine Ligands," European Journal of Inorganic Chemistry, 2016, pp. 5411-5417.
CN Office Action dated Nov. 17, 2022, in Application No. CN202080011300.3 with English translation.
KR Office Action dated Sep. 27, 2022, in Application No. KR10-2017-0102113 with English translation.
McCain, M.N. et al., "Aerosol-Assisted Chemical Vapor Deposition of Lubricating $MoS_2$ Films. Ferrous Substrates and Titanium Film Doping", Chemistry of Materials, 2008, vol. 20, No. 16, pp. 5438-5443.
U.S. Advisory Action dated Oct. 18, 2022, in U.S. Appl. No. 17/250,452.
U.S. Final Office Action dated Nov. 30, 2022 in U.S. Appl. No. 16/764,812.
U.S. Non-Final Office Action dated Nov. 30, 2022 in U.S. Appl. No. 17/814,207.
U.S. Supplemental Notice of Allowance dated Dec. 14, 2022 in U.S. Appl. No. 17/250,014.

* cited by examiner

SUBSTANTIALLY CARBON-FREE MOLYBDENUM-CONTAINING AND TUNGSTEN-CONTAINING FILMS IN SEMICONDUCTOR DEVICE MANUFACTURING

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

FIELD OF THE INVENTION

This invention pertains to methods of semiconductor device manufacturing. Specifically, embodiments of this invention pertain to deposition of molybdenum-containing films and tungsten-containing films in semiconductor processing.

BACKGROUND

In integrated circuit (IC) fabrication, deposition and etching techniques are used for forming patterns of materials, such as for forming metal lines embedded in dielectric layers. Some patterning schemes require conformal deposition of materials, where the deposited layer should follow the contour of protrusions and/or recessed features on the surface of the substrate. Atomic layer deposition (ALD) is often a preferred method of forming conformal films on a substrate, because ALD relies on adsorption of one or more reactants (precursors) to the surface of the substrate, and on subsequent chemical transformation of the adsorbed layer to the desired material. Because ALD uses sequential reactions that occur on the surface of the substrate, that are separated in time, and that are typically limited by the amount of the adsorbed reactant, this method can provide thin conformal layers having excellent step coverage.

Chemical vapor deposition (CVD) is another deposition method widely used in semiconductor processing. In CVD, the reaction occurs in the volume of the process chamber, and is not limited by the amount of reactants adsorbed to the substrate. As a result, CVD-deposited films are often less conformal than ALD-deposited films. CVD is typically used in applications where step coverage is less important.

ALD and CVD may employ plasma to promote the reactions of the deposition precursors resulting in the formation of the desired films. The methods that make use of the plasma are known as plasma enhanced ALD (PEALD) and plasma enhanced CVD (PECVD). The methods that do not employ plasma are referred to as thermal ALD and thermal CVD.

While ALD and CVD are most commonly used for deposition of silicon-containing films, such as silicon oxide, silicon nitride, and silicon carbide, these methods are also suitable for deposition of some metals, most notably tungsten and cobalt.

The background description provided herein is for the purposes of generally presenting the context of the disclosure. Work of the presently named inventor, to the extent it is described in this background section, as well as aspects of the description that may not otherwise qualify as prior art at the time of filing, are neither expressly nor impliedly admitted as prior art against the present disclosure.

SUMMARY

Methods for depositing substantially carbon-free molybdenum-containing and tungsten-containing films, such as metallic molybdenum, molybdenum nitride (MoN), molybdenum boride (MoB), molybdenum silicide (MoSi), and combinations thereof, such as (MOON) are provided. Semiconductor device structures containing such films (e.g., as liner layers, diffusion barrier layers, or electrode layers) are also provided.

In one aspect, a method of forming a substantially carbon-free metal-containing layer on a semiconductor substrate is provided. The method includes introducing a metal-containing precursor into a processing chamber housing the semiconductor substrate, wherein the precursor is a halide-free, carbonyl-free compound that comprises at least one ligand, bound to a metal selected from the group consisting of molybdenum and tungsten, wherein the halide-free, carbonyl-free compound does not include metal-carbon bonds and metal-oxygen double bonds. The method further involves reacting the metal-containing precursor with at least one reactant in an absence of plasma to form a metal-containing layer on the semiconductor substrate, wherein the formed metal-containing layer is a substantially carbon-free molybdenum-containing or tungsten-containing layer that has a carbon content of less than about 5 atomic % (such as less than about 2 atomic %), wherein the layer is selected from the group consisting of Mo, W, MoN, WN, MoON, WON, MoB, WB, MoSi, WSi and combinations thereof. The combinations, for example, may include MoNB, or WONSi layers. In some embodiments the molybdenum-containing or tungsten-containing precursor does not include beta-hydrogen atoms. In some embodiments, the formed layer is post-treated (e.g., by a plasma treatment) to modify electrical properties of the layer. In some embodiments the formed layer is an electrode layer in a pMOS (p-type metal-oxide-semiconductor) device.

In another aspect, a semiconductor device is provided, where the semiconductor device includes a substantially carbon-free metal-containing liner layer, wherein the metal is selected from the group consisting of molybdenum and tungsten, and wherein carbon content in the substantially carbon-free metal containing layer is less than about 3 atomic %, wherein the substantially carbon-free metal liner layer has a thickness of less than about 50 Å, a resistivity of less than about 3,000 and is positioned between a dielectric layer and a conductive layer. In some embodiments the substantially carbon-free liner layer is a diffusion barrier layer.

In another aspect, a semiconductor device comprising a gate electrode is provided, where the gate electrode comprises a substantially carbon-free metal-containing layer, wherein carbon content in the substantially carbon-free metal-containing layer is less than about 3 atomic %, and wherein the substantially carbon-free metal-containing layer has a work function of greater than 4.9 eV, and comprises a metal selected from the group consisting of molybdenum and tungsten. In some embodiments the substantially carbon-free metal-containing layer is a MoN layer.

In another aspect, an apparatus for forming a substantially carbon-free metal-containing layer on a semiconductor substrate is provided, where the apparatus includes: (a) a deposition processing chamber having a substrate support, an inlet for an introduction of a metal-containing precursor and a second inlet for an introduction of at least one reactant; (b) a plasma treatment processing chamber, different from the deposition processing chamber, wherein the plasma treatment processing chamber comprises a substrate support and an inlet for introducing a plasma treatment reactant; and (c) a controller comprising program instructions for: (i) causing a surface-limited reaction between the metal-containing precursor and at least one reactant in the deposition process chamber in an absence of plasma to form a layer of a substantially carbon-free metal-containing material, wherein the metal is selected from the group consisting of molybdenum and tungsten; (ii) causing transfer of the semiconductor substrate from the deposition processing chamber to the plasma treatment processing chamber without exposing the semiconductor substrate to an ambient atmosphere; and (iii) causing treatment of the substantially carbon-free metal-containing material by a plasma-activated plasma treatment reactant.

In another aspect, a flow mixer for mixing a carrier gas and a metal-containing precursor is provided. The flow mixer includes: (a) an outer fluidic conduit comprising an inlet for admitting the carrier gas into the outer fluidic conduit, a mixing zone for mixing the carrier gas with the metal-containing precursor and an outlet for removing the carrier gas mixed with the metal-containing precursor from the outer fluidic conduit; (b) an inner fluidic conduit positioned at least partially inside the outer fluidic conduit, wherein the inner fluidic conduit comprises an inlet for admitting the metal-containing precursor into the inner fluidic conduit, and an outlet configured to release the metal-containing precursor into the outer fluidic conduit, wherein a distance from the inlet of the inner fluidic conduit to the inlet of the outer fluidic conduit is greater than a distance from the outlet of the inner fluidic conduit to the inlet of the outer fluidic conduit, thereby supporting opposing flows of the carrier gas and of the metal-containing precursor in the flow mixer, wherein the distances refer to distances in a z-direction.

In another aspect, a method of depositing a metal-containing layer on a semiconductor substrate is provided, wherein the method includes: (a) mixing a metal-containing precursor with a carrier gas in the flow mixer provided herein; and (b) delivering the formed mixture to a processing chamber and reacting the metal-containing precursor with a reactant to form the metal-containing layer on the semiconductor substrate.

In another aspect, a multi-plenum showerhead for delivery of a plurality of reactants to a processing chamber is provided, where the multi-plenum showerhead includes: (a) a showerhead faceplate comprising a first plurality of conduits for delivery of a first reactant and a second plurality of conduits for delivery of a second reactant, wherein the first plurality of conduits is configured to be fluidically isolated from the second plurality of conduits; and (h) a showerhead housing positioned about the perimeter of the showerhead faceplate, wherein the showerhead faceplate is releasably attached to the showerhead housing.

In another aspect, a faceplate for a showerhead for a deposition apparatus is provided, wherein the faceplate comprises a first plurality of conduits for delivery of a first reactant and a second plurality of conduits for delivery of a second reactant, wherein the first plurality of conduits is configured to be fluidically isolated from the second plurality of conduits, and wherein the faceplate is configured to be releasably attachable to a showerhead housing.

In another aspect, a deposition apparatus for depositing a metal-containing layer on a semiconductor substrate is provided, wherein the deposition apparatus includes a multi-plenum showerhead provided herein.

These and other aspects of implementations of the subject matter described in this specification are set forth in the accompanying drawings and the description below.

DETAILED DESCRIPTION OF THE PREFERRED EMBODIMENTS

Figure 1A:
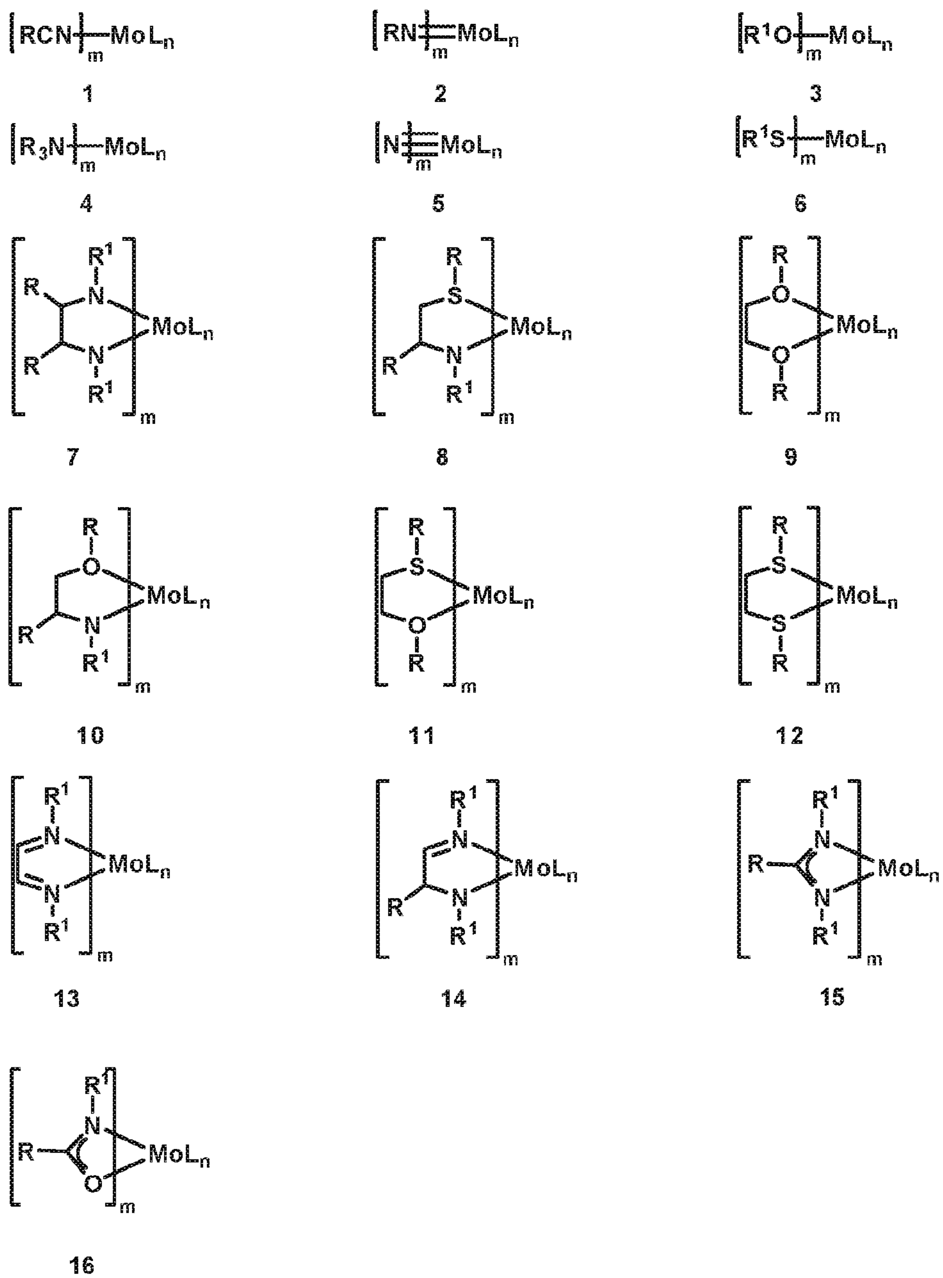
FIG. 1A provides examples of molybdenum precursors that can be used in the deposition methods according to embodiments provided herein.

Methods for depositing substantially carbon-free molybdenum-containing films and tungsten-containing films on semiconductor substrates are provided. These methods can be used, for example, for depositing a blanket substantially carbon-free metal-containing layer on a planar substrate, for depositing a conformal metal-containing layer on a substrate having one or more recessed or protruding features, and for filling recessed features with substantially carbon-free metal-containing materials. In some embodiments, methods are provided for forming substantially carbon-free metal-containing layers as liners or diffusion barrier layers on semiconductor substrates. In some embodiments, methods are provided for forming substantially carbon-free metal-containing layers as electrode layers in pMOS devices.

The methods can be used for deposition of a variety of molybdenum-containing and tungsten-containing materials including, but not limited to molybdenum metal (Mo), molybdenum nitride (MoN), molybdenum boride (MoB), molybdenum silicide (MoSi), and molybdenum oxynitride (WON), tungsten metal (W), tungsten nitride (WN), tungsten boride (WB), tungsten silicide (WSi), and tungsten oxynitride (WON), where the stoichiometry of these compounds may vary, and the listed formulas are not indicative of stoichiometry. For example, MoN can include, in various embodiments, between about 10-70 atomic % of nitrogen.

The term "substantially carbon-free" refers to materials with carbon content of less than about 5 atomic %, where hydrogen (if present) is excluded from the calculations. In some embodiments, provided substantially carbon-free films include less than about 3 atomic % carbon, such as less than about 2 atomic % carbon.

"Metal", e.g. "metallic molybdenum" or "metallic tungsten" as used herein, refers to material that consists essentially of metal (e.g., Mo or W). Other elements (e.g., B, Si, N, or C)) can be present in the metal in small quantities (e.g., with a total content of less than about 15 atomic %, or less than about 10%, where hydrogen is not included in the calculation).

Molybdenum nitride (MoN), molybdenum boride (MoB), molybdenum silicide (MoSi), molybdenum oxynitride (MoON), tungsten nitride (WN), tungsten boride (WB), tungsten silicide (WSi), tungsten oxynitride (WON), refer to materials that consist essentially of the listed elements, where the stoichiometry of these compounds may vary and is not determined by the listed formulas (e.g., MoN does not necessarily indicate 1:1 Mo:N stoichiometry). Other elements may be present in these compounds in small quantities, e.g., in an amount of less than about 10% atomic, where hydrogen is excluded from the calculation.

The term "semiconductor substrate" as used herein refers to a substrate at any stage of semiconductor device fabrication containing a semiconductor material anywhere within its structure. It is understood that the semiconductor material in the semiconductor substrate does not need to be exposed. Semiconductor wafers having a plurality of layers of other materials (e.g., dielectrics) covering the semiconductor material; are examples of semiconductor substrates. The following detailed description assumes the disclosed implementations are implemented on a semiconductor wafer, such as on a 200 mm, 300 mm, or 450 mm semiconductor wafer. However, the disclosed implementations are not so limited. The work piece may be of various shapes, sizes, and materials. In addition to semiconductor wafers, other work pieces that may take advantage of the disclosed implementations include various articles such as printed circuit boards and the like.

The term "about" when used in reference to numerical values includes a range of ±10% of the recited numerical value, unless otherwise specified.

The term "alkyl", as used herein, refers to saturated substituents containing exclusively carbon and hydrogen atoms. Alkyls include both linear, branched and cyclic groups. Examples of linear alkyl groups include without limitation, methyl groups, ethyl groups, n-propyl groups, n-butyl groups, etc. Examples of branched alkyls groups include without limitation, isopropyl, isobutyl, sec-butyl, and t-butyl. Examples of cycloalkyls include without limitation, cyclopropyl groups, cyclopentyl groups, cyclohexyl groups, etc.

The term "fluoroalkyl", as used herein, refers alkyl groups containing one or more fluorine substituents. In some implementations fluoroalkyls contain exclusively fluorine substituents, such as in $CF_3$, $C_2F_5$, $C_3F_7$. Fluoroalkyls may be linear, branched and cyclic.

The term "alkylsilyl", as used herein, refers to $SiR_3$ group, wherein at least one R is an alkyl, and each R is independently selected from H and an alkyl. Alkylsilyls include mono, bis, and tris alkylsilyls. Examples of alkylsilyls include trimethylsilyl, dimethylsilyl methylsilyl, triethylsilyl, diethylsilyl, and ethylsilyl.

The term "alkylamino", as used herein, refers to $NR_2$ group, wherein at least one R is an alkyl, and each R is independently selected from H and an alkyl. Examples of alkylamino substituents include dimethylamino and diethylamino substituents.

The term "alkoxy", refers to an OR, group, where R is an alkyl. Examples of alkoxy groups include methoxy, ethoxy, propoxy groups.

The term "independently selected", when referring to R substituent selection in a molecule containing multiple R groups, means that the selection of R substituents at different atoms of a molecule is independent and that the selection of R substituents at one atom having multiple R substituents is also independent.

The term "metalorganic precursors" as used herein refer to metal-containing compounds that include at least one carbon-containing ligand, where the compounds do not contain metal-carbon bonds.

The embodiments of the invention are described primarily making reference to molybdenum-containing precursors and films, as examples. It is understood that the general descriptions and principles also apply to tungsten-containing precursors and films.

Deposition of molybdenum-containing and tungsten-containing films with desirable properties on semiconductor substrates presented several problems, which hindered integration of these films in many of the device fabrication process flows. Specifically, the use of halide-containing molybdenum and tungsten CVD and ALD precursors can lead to inadvertent etching of the substrate. Metalorganic and organometallic precursors can eliminate the integration problems in semiconductor processing caused by halide-containing precursors, but because molybdenum and tungsten form very stable carbide phases, the use of carbon-containing precursors often leads to incorporation of large amounts of carbon into the formed films. Carbon-containing films are not desired for many applications, as presence of carbon may increase the resistivity of the films and lower the work function of the films.

Methods for deposition of substantially carbon-free molybdenum-containing and tungsten-containing films are provided. These methods are useful for depositing molybdenum-containing and tungsten-containing materials such as nitrides, borides, silicides, oxynitrides, and combinations thereof. Some materials deposited by these methods are used as MOSFET (metal-oxide-semiconductor field-effect transistor) gate electrode materials. Since carbon has a negative impact on effective work function in early transition metal films, these methods are advantageous for producing films which have a high work function (e.g., greater than about 5 eV) suitable for pMOS structures. Some materials deposited by these methods are also useful as ultrathin low resistivity liner and/or barrier materials. In some embodiments, these methods are carried out in an integrated multi-chamber apparatus including, for example, a deposition chamber and a plasma treatment chamber, where the substantially carbon-free film is deposited by CVD or ALD in an absence of plasma in a deposition chamber, and is treated with a plasma in a plasma treatment chamber. The plasma treatment can be used to tune the film composition, densify the formed film, and/or to tune the effective work function of the formed material.

The provided methods utilize a halide-free molybdenum-containing or tungsten-containing metalorganic compound as a CVD or ALD precursor, where the metalorganic compound does not include metal-carbon (molybdenum-carbon or tungsten-carbon) bonds and does not include carbonyl (CO) ligands. Further, in some embodiments the precursor does not include beta hydrogen atoms. The deposition is carried out by reacting the precursor with a reactant, preferably in an absence of plasma. In some embodiments the reaction is carried out at a temperature of less than about 450° C., such as less than about 420° C. in an absence of plasma. The careful selection of the precursor advantageously allows to avoid substantial incorporation of carbon into the formed film, and films with carbon content of less than about 5 atomic %, such as less than about 3 atomic % can be formed.

This result is unexpected, because the metalorganic precursors contain carbon, and it can be expected that due to high affinity of molybdenum and tungsten to carbon, carbon incorporation in the films would necessarily occur at high levels. However, it was discovered that when metals in the precursors do not form direct bonds with carbon and when the precursors do not include carbonyl ligands, incorporation of carbon into the films can be avoided, particularly if plasma is not used during the deposition reactions. Another factor that can significantly reduce carbon incorporation into the films is an absence of beta-hydrogens in the ligands of the metal-containing precursor. It is believed that beta-hydrogen can lead to a low-energy reaction pathway leading to incorporation of carbon into the film even at low temperature deposition conditions. The absence of beta hydrogens may stabilize the ligands against decomposition and allow for the ligands to be removed intact during the subsequent reactant gas exposure.

In some embodiments the metal-containing precursors, used herein include a metal (e.g., molybdenum or tungsten) that forms bonds only to elements selected from the group consisting of N, O, and S. In some embodiments the precursors preferably do not include beta hydrogen atoms. For example, in some embodiments the precursors include carbon bonded to three alkyl groups at beta positions. In some embodiments, the precursor does not include metal-oxygen double bonds (M=O).

In some embodiments precursors which can be used for deposition include halide-free molybdenum and tungsten complexes bearing at least one of a monodentate ligand such as an amine, a nitrile, an imide, a nitride, an alkoxide, or a thiolate, or halide-free molybdenum and tungsten complexes bearing multidentate ligands which bond to the metal through N, O, or S atoms. The ligands preferentially do not contain β-hydrogen atoms.

Examples of suitable molybdenum-containing precursors 1-16 are shown in FIG. 1, where each L is a carbon-containing ligand that does not form metal-carbon bonds, and where m is in integer between 1-4, and n is an integer between 1-4. Each R and R1 is independently selected from the group consisting of an alkyl, fluoroalkyl, and alkylsilyl. In some embodiments, each R1 is selected such that it does not provide beta hydrogen atoms. Examples of such R1 substituents include t-butyl and trialkylsilyl substituents. It is noted that in some embodiments, R substituents at the O and S atoms, may provide beta hydrogen atoms, as at these positions the beta hydrogens are not readily eliminated and are not expected to lead to carbon contamination of the resulting films. Further, in compounds 7, 8, and 14, beta hydrogens at the alkyl-substituted carbon atoms adjacent to anionic nitrogen are also stabilized, and these stabilized compounds are also suitable for deposition of provided films.

In some embodiments, both R and R1 do not provide beta hydrogen atoms. In some embodiments the precursor does not include beta hydrogen atoms. For example, in some embodiments the precursor is any of the compounds 1, 2, 3, 4, 5, 6, 15, and 16, where each of R, R1 and L does not provide beta hydrogen atoms.

Figure 1B:
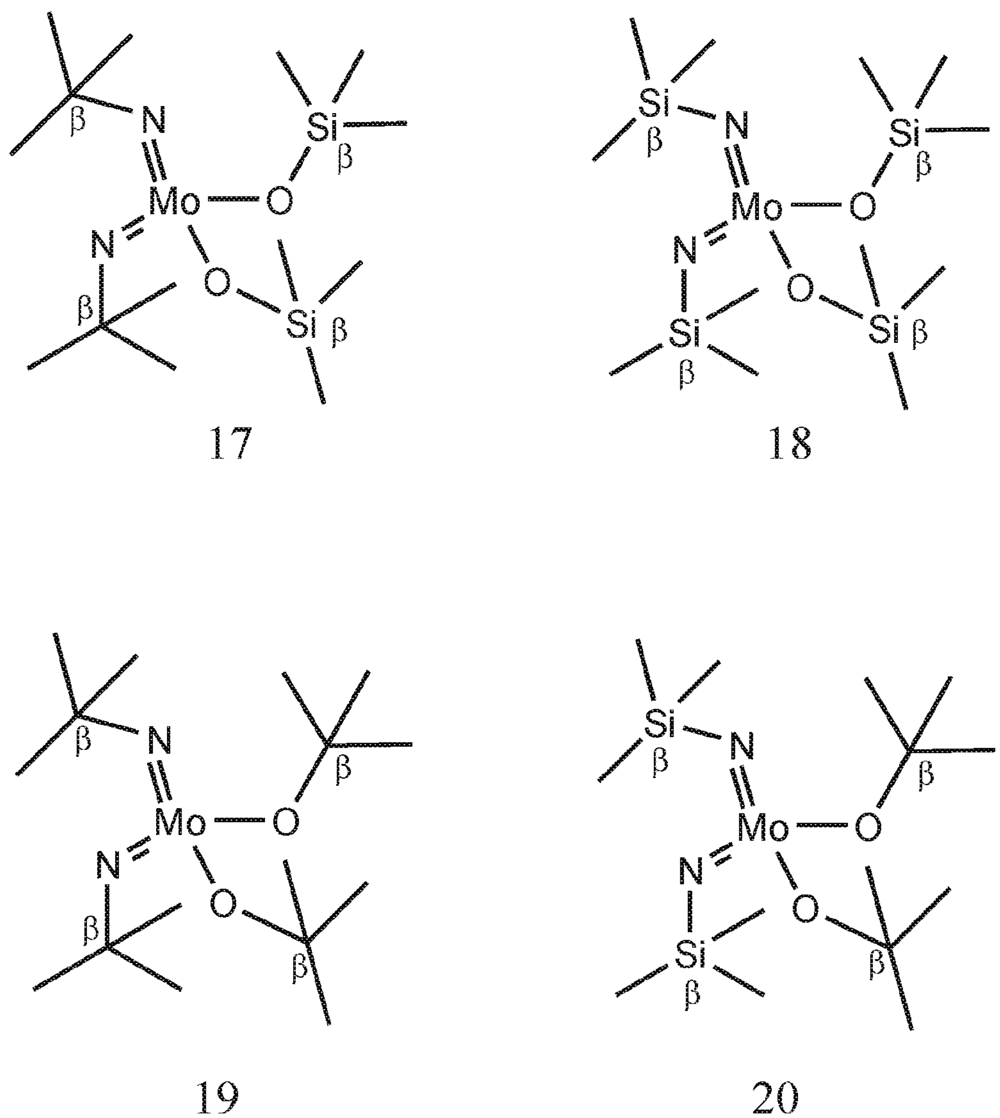
FIG. 1B provides several specific examples of molybdenum precursors that can be used in the methods according to embodiments provided herein.

More specific examples of molybdenum-containing precursors are shown in FIG. 1B, which depicts structures 17-20. It can be seen that molybdenum forms bonds only to N and O atoms, and that the precursors do not include any hydrogen atoms at beta positions. The precursors can be synthesized by reacting a molybdenum starting material, such as a halide-containing molybdenum starting material with the deprotonated ligands. Exemplary synthetic routes are described in the US Patent Application Publication No. 2018/0355484.

The precursors used for deposition are amenable to vaporization and are stable at target temperatures and pressures. For example, in some embodiments the precursors are used in deposition reactions at temperatures of less than about 450° C., such as less than about 420° C. In order to maintain appropriate volatility, in many embodiments discussed herein, the precursors having molecular weights of less than about 450 g/mol, such as less than about 400 g/mol are selected.

Figure 2:
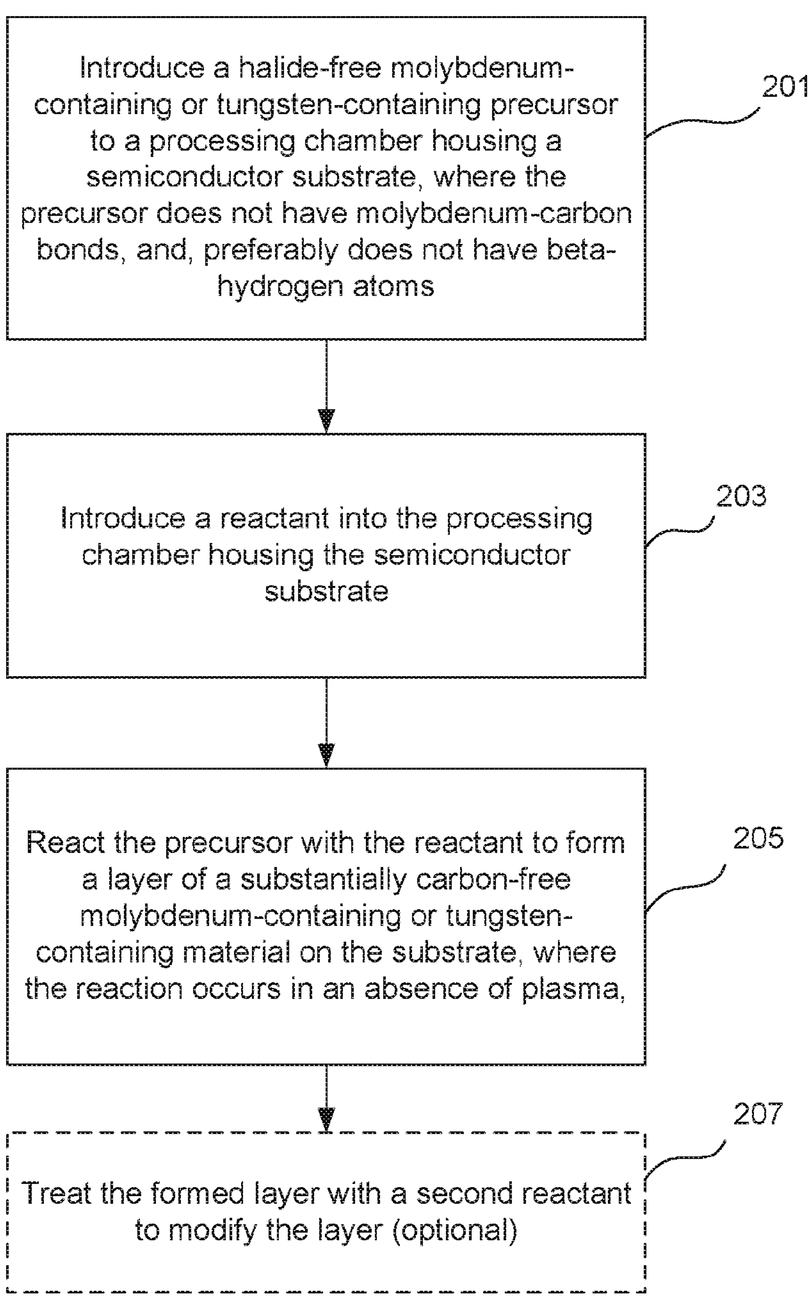
FIG. 2 is a process flow diagram for a method of forming metal-containing films according to an embodiment provided herein.

Substantially carbon-free molybdenum-containing and tungsten-containing materials can be deposited using the precursors described herein by a variety of deposition methods, such as CVD, and ALD. An exemplary method for deposition of a molybdenum-containing or tungsten-containing layer is illustrated by a process flow diagram shown in FIG. 2. The process starts in 201 by introducing a halide-free molybdenum-containing or tungsten-containing precursor into a process chamber housing the semiconductor substrate. The precursor does not include metal-carbon bonds, and, preferably does not include beta hydrogen atoms. The precursor can be introduced in a vaporized form in a flow of inert gas such as argon, helium, or nitrogen ($N_2$). In operation 203 (which can occur before, after, or during introduction of the molybdenum-containing precursor 201) a reactant is introduced into the process chamber housing the substrate. In some embodiments, introduction of the metal-containing precursor and of the reactant is sequential. The chemistry of the reactant depends on the chemistry of the target molybdenum-containing or tungsten-containing film. For example, for deposition of metal (Mo or W), the second reactant is typically a reducing reactant (e.g., $H_2$). Deposition of metal nitride can be carried out using a nitrogen-containing reactant (e.g., $NH_3$, or $N_2H_4$). In some embodiments, metal nitrides are deposited using $H_2$ as a reactant, and the requisite nitrogen can be supplied by the ligand. Deposition of metal boride can be performed using a boron-containing reactant (e.g., $B_2H_6$). Metal silicides can be formed using a silicon-containing reactant (e.g., $SiH_4$ or $Si_2H_6$).

In some embodiments the precursor and the reactant are allowed to mix in the body of the processing chamber. In other embodiments, after the metal-containing precursor has been introduced and has been adsorbed on the surface of the substrate, the processing chamber is purged with an inert gas and/or evacuated to remove the unadsorbed precursor from the process chamber. In some embodiments the layer of the precursor on the substrate is adsorption-limited. In other embodiments a thicker layer of precursor can be formed on the surface of the substrate prior to purging and/or evacuation of the process chamber. It is noted that when the precursor and the reactant are introduced sequentially, the sequence of introduction of the precursor and of the reactant may be reversed, in some embodiments the reactant is introduced first and is allowed to adsorb on the surface of the substrate. Then the process chamber is purged and/or evacuated to remove the second reactant from the volume of the process chamber, and the precursor is then introduced.

Referring to operation 205, the precursor is reacted with the reactant to form a layer of a substantially carbon-free molybdenum-containing material on the substrate, where the reaction occurs on the surface of the substrate and/or in the body of the processing chamber, and is preferably performed in an absence of plasma. For example, in CVD processes the precursor and reactant may be introduced simultaneously into the body of the processing chamber, where reaction occurs continuously either the body of the processing chamber or on the surface. In ALD processes the reaction occurs only on the surface and is limited by the amount of the adsorbed material on the surface (by the amount of precursor and/or by the amount of adsorbed reactant). The temperature during the reaction process can be, for example, between about 20-600° C. Low temperature deposition at about 450° C. or less such as about 420° C. or less, e.g., between about 200-400° C. is conducted in some embodiments and is particularly advantageous for deposition of substantially carbon-free films. The pressure in the process chamber can be in a range of between about 0.1-100 Torr, such as between about 1-60 Torr in thermal ALD, such as about 10 Torr After the reaction is completed, the formed molybdenum-containing or tungsten-containing layer can be optionally treated with a second reactant to modify the layer, as shown in operation 207. The treatment may be performed in order to tune the properties of the layer, such as to densify the layer, modify the composition or electrical properties of the layer, reduce the resistivity of the layer, etc. The treatment is, in some embodiments, plasma-assisted. For example, the substrate may be treated with a direct plasma (formed in the compartment housing the substrate), or a remote plasma (formed away from the substrate and introduced into the compartment housing the substrate). The use of remote plasma is preferred in some cases as it reduces the damage to the substrate. In one of preferred embodiments, the substantially carbon-free molybdenum-containing or tungsten-containing layer is deposited in an absence of plasma. The substrate is then transferred to a plasma treatment process chamber without exposing the substrate to an ambient atmosphere, where the substrate is treated with a plasma treatment reactant. The choice of plasma treatment reactant depends on the desired properties of the final layer. The substrate may be treated for example with plasma-activated $H_2$, $NH_3$, $N_2$, $BH_3$, $SiH_4$, Ar, He, and mixtures thereof.

Figure 3:
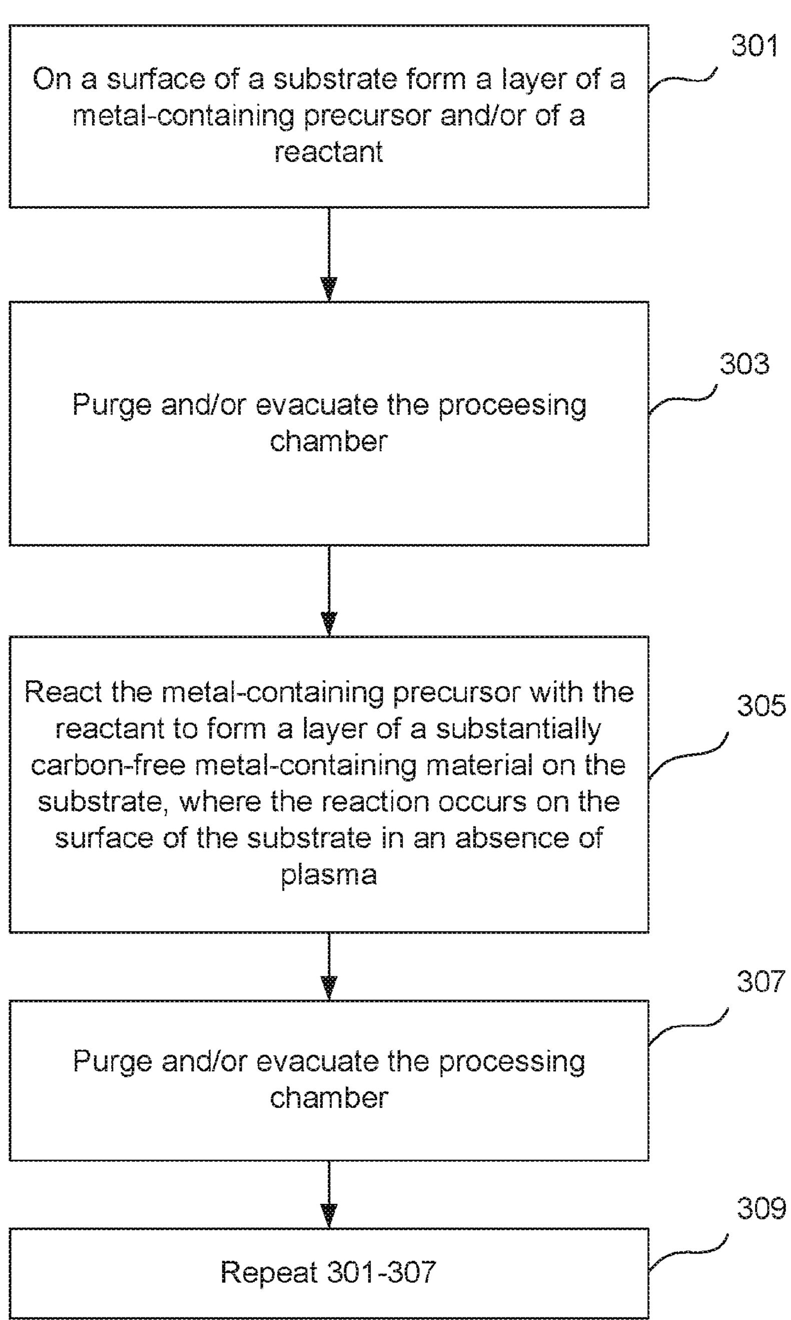
FIG. 3 is a process flow diagram for a method of forming metal-containing films according to an embodiment provided herein.

An example of a surface-based deposition process for forming a molybdenum-containing or tungsten-containing film on a substrate is illustrated by a process flow diagram shown in FIG. 3. In operation 301, a layer of a metal-containing precursor and/or of a reactant is formed on a surface of a substrate. In some embodiments the layer is an adsorption-limited layer. Next in operation 303, the processing chamber is purged and/or evacuated. This step ensures that the precursor and/or reactant are present only on the surface of the substrate and not in the volume of the processing chamber. Next, in 305 the precursor is reacted with the reactant on the surface of the substrate. For example, if only a metal-containing precursor is adsorbed on the surface of the substrate in 301, a reactant may be introduced into the processing chamber and allowed to react with the precursor on the surface. If both the metal-containing precursor and the reactant layers are formed on the surface of the substrate in 301, in 313 the process conditions can be adjusted (e.g., using a temperature increase) to activate the reaction. Next, in 307 the processing chamber is purged and/or evacuated, and in 309 operations 301-307 are repeated to form more metal-containing material. In some embodiments each cycle of operations 301-307 deposits about 0.1-5 Å of metal-containing material on average. In some embodiments, 1-100, such as 2-100 cycles are performed. For example, 1-20, such as 2-20 cycles can be performed. Substantially carbon-free molybdenum-containing and tungsten-containing layers with thicknesses of between about 5-500 Å, such as 5-50 Å can be formed with high level of control over layer thickness. This method can be used to form conformal layers with excellent step coverage.

In some embodiments the as-deposited substantially carbon-free molybdenum-containing and tungsten-containing films are treated with a second reactant to modify the properties of the film, such as density, resistivity, or effective work function.

Figure 4A:
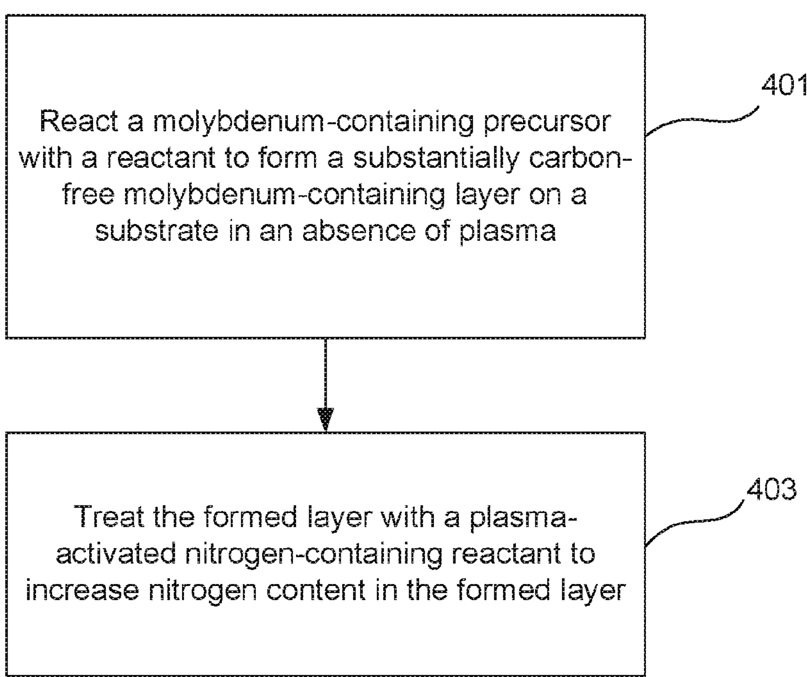
FIG. 4A is a process flow diagram for a method of treating metal-containing films according to an embodiment provided herein.

FIG. 4A provides a process flow diagram for one example of a film modifications. The process starts in 401 by reacting a molybdenum-containing precursor with a reactant to form a substantially carbon-free molybdenum-containing films on a substrate in an absence of plasma, example, a MoN layer can be formed using several cycles of reacting a halide-free metalorganic molybdenum-containing precursor with $NH_3$ or $H_2$ in an absence of plasma on a surface of the substrate. Next, in operation 403, the film is treated with a plasma-activated nitrogen-containing reactant to increase the nitrogen content in the film. For example, the MoN film can be treated with a plasma formed in a process gas containing $N_2$ to increase the nitrogen content in the MoN layer. In some embodiments nitrogen content is increased by such treatment by at least 5%, such as by at least 10%. Increase of nitrogen content in the MON layer is associated with an increase in work function. In some embodiments the work function increase due to this treatment is at least 30 meV, such as 50-200 meV. In some embodiments, the MoN material obtained after the treatment has a nitrogen content of at least 25 atomic % and a work function of at least about 5.0 eV, such as at least 5.2 eV.

Figure 4B:
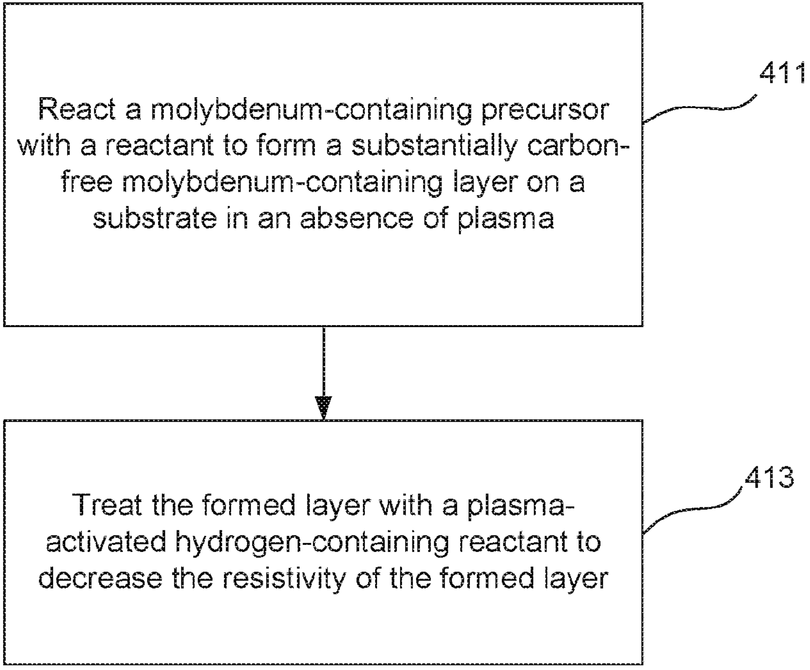
FIG. 4B is a process flow diagram for a method of treating metal-containing films according to an embodiment provided herein.

Another example of a post-treatment is illustrated by the process diagram shown in FIG. 4B. In this example, the process starts as in FIG. 4A by reacting a molybdenum-containing precursor with a reactant to form a substantially carbon-free molybdenum-containing layer in 411. Next, in 413, the formed layer is treated with a plasma-activated hydrogen-containing reactant to decrease resistivity of the layer. For example, a substantially carbon-free molybdenum nitride layer may be treated with a plasma formed in a process gas that contains $H_2$, resulting in substantial decrease of the films' resistivity. In some embodiments the resistivity can be decreased by this treatment by at least 20%, such as at least 50%, or even at least 80%. In some embodiments, the $H_2$ plasma treatment decreases the resistivity of the film at least two-fold, three-fold, or five-fold. In some embodiments, films with resistivities of less than about 1,000 $\mu\Omega\cdot$cm, such as less than about 800 $\mu\Omega\cdot$cm are obtained after $H_2$ plasma treatment. In some embodiments, plasma treatment (e.g., plasma treatment using hydrogen-containing reactants, such as $H_2$) is further used to densify the as-deposited films. For example, density of the film can be increased by at least 20%, such as by at least 40% by $H_2$ plasma post-treatment.

The provided substantially carbon-free molybdenum-containing and tungsten-containing films can be deposited on a variety of surfaces including on metals (e.g., copper, nickel, cobalt, tungsten, etc.), dielectrics (e.g., silicon oxide based dielectrics, silicon nitride, silicon carbide, metal oxides, metal nitrides, etc.), and on amorphous and crystalline silicon. In some embodiments the films are deposited as liners or diffusion barrier layers.

Figure 5:
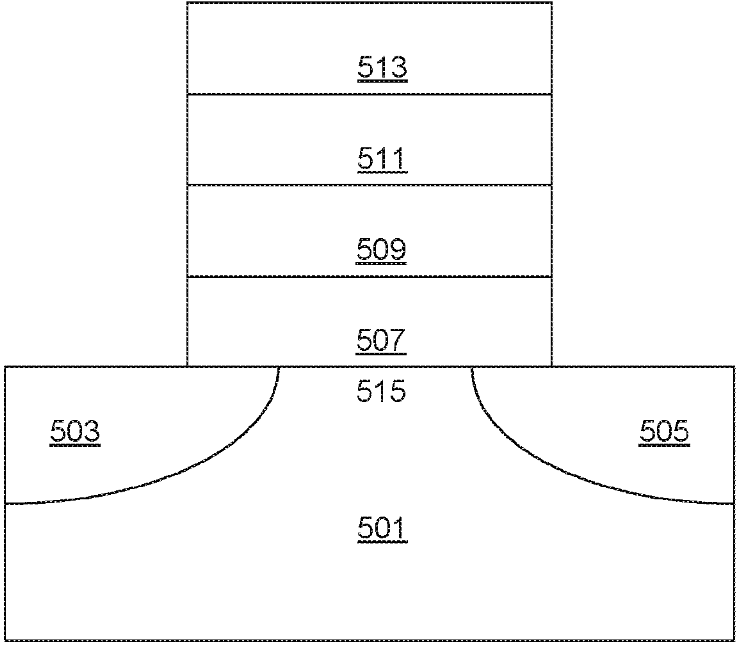
FIG. 5 is a schematic cross-sectional view of a pMOS device structure containing a layer of substantially carbon-free metal-containing material, in accordance with an embodiment provided herein.

In one implementation, provided substantially carbon-free metal-containing films are used as MOSFET gate electrode materials. In one example, the provided films are integrated into a pMOS device structure. A schematic cross-sectional view of a pMOS device is shown in FIG. 5. The device (e.g., a transistor) includes a semiconductor layer 501, a source region 501, a drain region 503, and a gate dielectric layer 505 formed over the semiconductor layer 501, and defining a channel region 515 in the semiconductor layer 501 between the source region 501 and a drain region 503. The semiconductor layer 501 includes a semiconductor material, such as silicon (Si), germanium (Ge), or silicon germanium (Site). The gate dielectric layer 505 includes, in one embodiment, a high-k dielectric having a dielectric constant of greater than about 3.9. For example, the gate dielectric layer 505 may include high-k materials, such as HfO, HfSiO, HfSiON, and the like. The gate dielectric layer is typically very thin, e.g., between about 10-15 Å thick. Layers 509, 511 and 513 are disposed over the gate dielectric layer 505, and collectively form the gate electrode. Layer 509 is an optional capping layer formed directly over and in contact with the gate dielectric layer 505. The capping layer 509 includes, in some embodiments TiN, TaN and/or WN, and has a thickness of between about 10-20 Å. The layer 511 over the capping layer 509 is referred to a work function metal-containing layer. The layer 511 includes a substantially carbon-free molybdenum-containing or tungsten-containing material provided herein, where the material has a high work function, such as a work function of greater than about 4.9 eV, greater than about 5.0 eV, or greater than about 5.1 eV, In some embodiments, the layer 511 is a substantially carbon-free MoN layer having an effective work function of greater than about 5.0. The substantially carbon-free layer is deposited by ALD or CVD methods described herein, and in some embodiments, is additionally treated with a plasma treatment reactant, to increase its work function. For example, in some embodiments, the as-deposited substantially carbon-free molybdenum-containing or tungsten-containing material is treated with a plasma-activated nitrogen-containing reactant (e.g., $N_2$) to increase nitrogen content, and work function of the formed layer. The layer 511, in some embodiments, has a thickness of between about 5-50 Å, or 5-15 Å. In one implementation the work function metal-containing layer 511 has a thickness of about 30 Å. In some embodiments the substantially carbon-free metal-containing layer 511 is deposited directly onto the capping layer 509, When capping layer 509 is absent, the layer 511 may be deposited directly onto the gate dielectric layer 507. Finally, the device optionally may include one or more conductive layers 513 formed over the substantially carbon-free metal-containing layer 511. In some embodiments the conductive layer 513 includes one or more of TiAl, TiAlC, TiAlON, and/or a conductive metal fill, such as Mo, Co, or W. The device shown in FIG. 5 is a schematic view of a partially fabricated device that does not depict contacts formed to source and drain regions, which can be formed after formation of the electrode layers.

The provided substantially carbon-free molybdenum-containing and tungsten-containing layers may be used in a planar pMOS device, a FinFET pMOS device or in a gate all-around (GAA) pMOS device. Films with work functions of greater than 5.0 eV, such as between about 5.0-5.5 eV, can be obtained.

Figure 6A:
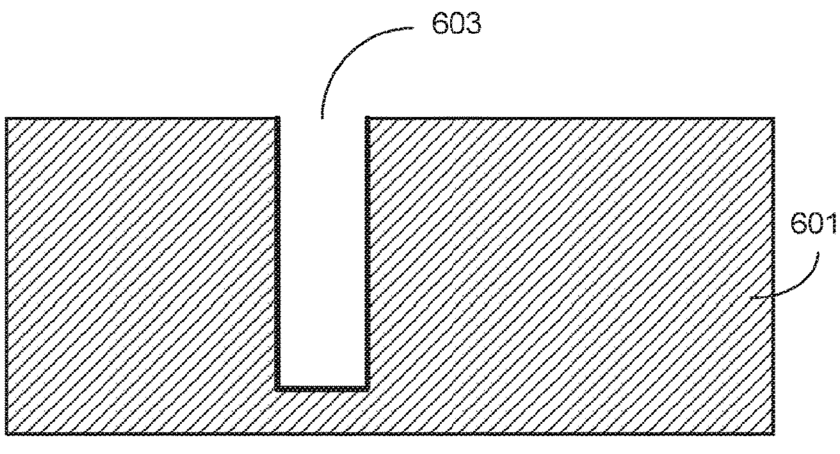
FIGS. 6A-6C are schematic cross-sectional views of a semiconductor device during fabrication, in accordance with an embodiment provided herein.
Figure 6B:
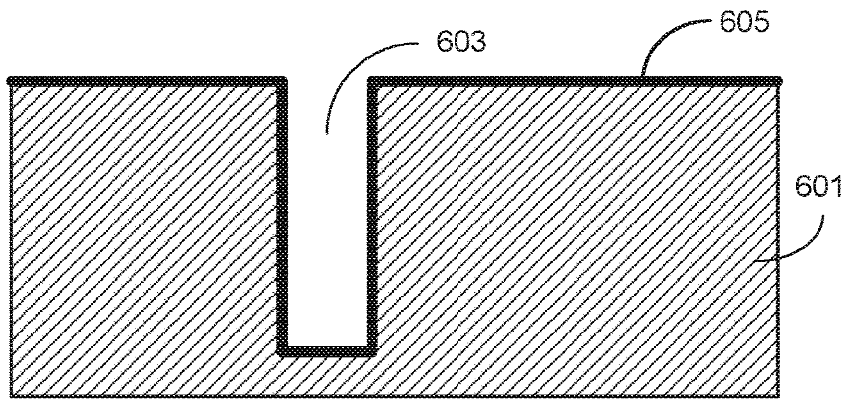
Figure 6C:
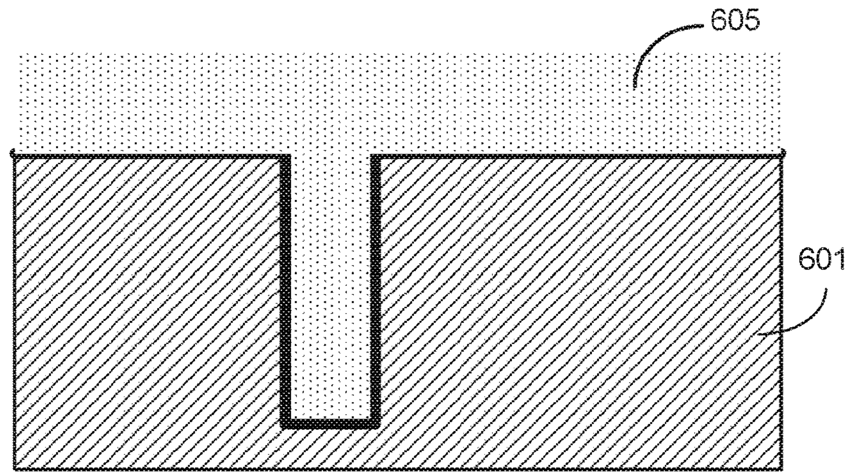

In another application, the substantially carbon-free films are deposited as diffusion barrier layers on a substrate containing recessed features, such as vias and trenches. Schematic cross-sectional views of an exemplary substrate during fabrication are shown in FIGS. 6A-6B. Referring to FIG. 6A, a substrate containing a dielectric layer 601 is provided, where the dielectric may be a silicon oxide based inter layer dielectric, e.g., a low-k dielectric, having a recessed feature 603 formed therein. Referring to FIG. 6B, a substantially carbon-free molybdenum-containing or tungsten-containing film 605 is deposited conformally over the dielectric 601, where the film lines the recessed features. Conformal films are preferably deposited by AT D using the precursors as described herein. In some embodiments the film 605 is deposited directly onto the dielectric. In other embodiments, one or more additional layers, such as adhesion layers may be formed on the dielectric before film 605 is deposited. Next, referring to FIG. 6B, the recessed feature 603 is filled with metal, such as with copper or cobalt. Copper or cobalt may be deposited, for example, by electrodeposition onto a thin conformal metal seed layer (not shown). The formed structure includes a thin layer of substantially carbon-free molybdenum-containing or tungsten-containing layer positioned between a dielectric layer and a metal-filled via or a trench. In some embodiments, the film 605 has a thickness of between about 5-50 Å, such as between about 10-30 Å. In some embodiments the film 605 is a diffusion barrier layer, which prevents diffusion of copper into the dielectric. Examples of suitable diffusion barrier materials include MoN, and WN. In some embodiments the film 605 is an adhesion layer that may promote adhesion of a conventional diffusion barrier layer (e.g., TaN, TiN) to a conductive seed layer. Examples of suitable adhesion layer materials include Mo, and MoN with a relatively low nitrogen content. In many embodiments it is preferable that the film 605 is a low-resistivity film, such as a film with a resistivity of less than about 1000 μΩ·cm, such as less than about 500 μΩ·cm. In some embodiments, these films are formed using a plasma post-treatment of as-deposited substantially carbon-free films, where the post-treatment reduces the resistivity of the as-deposited film. For example, in some embodiments deposited films (e.g., MoN or WN films) are post treated with a plasma formed in a hydrogen-containing gas (e.g., $H_2$), as described with reference to FIG. 4B.

It is noted that while the description provided herein uses molybdenum deposition as an example, tungsten-containing layers can be deposited using similar precursors and conditions. For example, tungsten-containing precursors having the same structures as shown in FIGS. 1A and 1B (with molybdenum substituted for tungsten) can be used.

EXPERIMENTAL EXAMPLES

Example 1. Substantially carbon-free MoN films were deposited on $SiO_2$ substrates using bis(tert-butylimido)bis(tert-butoxy)molybdenum (compound 19) shown in FIG.

1B, as a molybdenum-containing precursor. The substrates were exposed to the precursor 19 in an ALD process chamber; then the process chamber was purged to remove the nonsurface-bound precursor, and the substrates were then contacted with a reactant ($NH_3$ $H_2$ or a combination of $NH_3$ and $H_2$, either in a mixture or sequentially) to react the precursor on the surface of the substrate. The process chamber was purged, and the precursor and reactant dosing were repeated. Between 1 and 500 ALD cycles was used. The depositions were performed in an absence of plasma at temperatures of between 300-400° C.

Composition analysis of deposited MoN films by both x-ray photoelectron spectroscopy (XPS) and secondary ion mass spectrometry (SIMS) showed carbon contents of between 0.2-2 atomic %. Film resistivities were 500-4,000 μΩ·cm for film thicknesses between 2-10 nm.

A 2 nm thick film was subjected to a $H_2$ plasma treatment for 60 seconds. The film was treated at 400° C. with a remotely generated plasma (13.56 MHz, 2 kW) in a process gas comprising $H_2$. The resulting 1 nm film, as measured by TEM, had a resistivity of about 600 μΩ·cm illustrating a 6-fold reduction in resistivity compared to the initial 3600 μΩ·cm resistivity for the as-deposited film.

Example 2 (comparative). Substantial carbon incorporation was demonstrated to occur when molybdenum precursor is treated with a reactant in a plasma. MoC films were deposited on $SiO_2$ substrates using bis(tert-butylimido)bis(tert-butoxy)molybdenum (compound 19) shown in FIG. 19 as a molybdenum-containing precursor. The substrate was exposed to the precursor 19 in an ALD process chamber; then the process chamber was purged to remove the non-surface bound precursor; and the substrate was then contacted with a plasma formed in $H_2$ to react the precursor on the surface of the substrate. The process chamber was purged, and the precursor and reactant dosing were repeated. 200 ALD cycles was used. The deposition was performed at a temperature of 250° C. Composition analysis of a 15 nm film by X-ray photoelectron spectroscopy showed 58 atomic % Mo and 41 atomic % C. It is believed that the energetic plasma reactant induces uncontrolled decomposition of organic ligands, which enables ready formation of highly thermodynamically stable Mo carbide films. Thus, it is difficult to achieve substantially carbon-free metallic Mo-containing films using a plasma reactant.

Example 3. A plasma treatment with a mixture of $N_2$ and argon was performed on a 3 nm substantially carbon-free MoN film at 400° C. for 150 seconds. The plasma was generated remotely at a power of 3 kW. MOS capacitors were fabricated and the effective work function was obtained by extrapolating the plot of flat-band voltage versus effective oxide thickness to zero. The plasma-treated film showed an effective work function increase of approximately 0.08 eV versus the untreated film. Separate experiments to determine the composition change due to the plasma treatment showed approximately 10% higher nitrogen content after plasma treatment.

Apparatus

The deposition methods described herein can be carried out in a variety of apparatuses. A suitable apparatus includes a processing chamber having one or more inlets for introduction of reactants, a substrate holder in the process chamber configured to hold the substrate in place during deposition, and, optionally, a plasma generating mechanism configured for generating a plasma in a process gas. The apparatus may include a controller having program instructions for causing any of the method steps described herein. The deposition methods described herein may be carried out in corresponding ALD and CVD apparatuses available from Lam Research Corp. of Fremont, Calif., such as Altus® Vector®, and Striker® tools.

For example, in some embodiments the apparatus includes a controller having program instructions that include instructions for: causing an introduction of a molybdenum or tungsten precursor to the processing chamber, wherein the precursor is any of the precursors described herein; and causing a reaction between the precursor and a reactant to form a layer of substantially carbon-free molybdenum-containing or tungsten-containing material on a substrate. The controller may include program instructions for causing any of the methods described herein.

Figure 7:
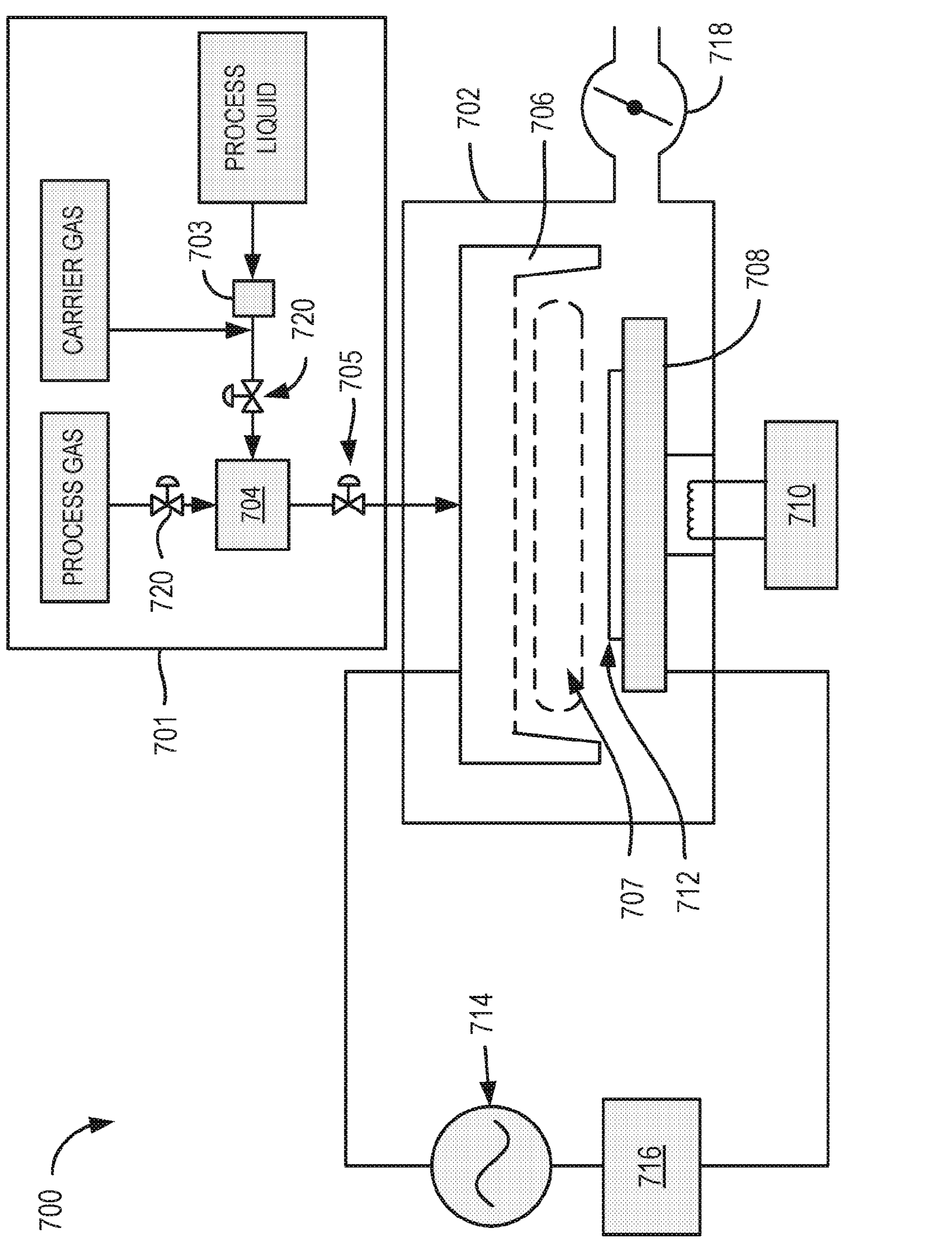
FIG. 7 is a schematic presentation of an apparatus that is suitable for depositing molybdenum-containing films, according to an embodiment provided herein.

An example of a deposition apparatus suitable for depositing molybdenum-containing films using provided methods is shown in FIG. 7. FIG. 7 schematically shows an embodiment of a process station 700 that may be used to deposit material using atomic layer deposition (ALD) and/or chemical vapor deposition (CVD), either of which may be optionally plasma enhanced. It is noted that in many embodiments plasma-enhancement of deposition reaction is avoided to prevent incorporation of carbon into the films. For simplicity, the process station 700 is depicted as a standalone process station having a process chamber body 702 for maintaining a low-pressure environment. However, it will be appreciated that a plurality of process stations 700 may be included in a common process tool environment. Further, it will be appreciated that, in some embodiments, one or more hardware parameters of process station 700, including those discussed in detail below, may be adjusted programmatically by one or more computer controllers.

Process station 700 fluidly communicates with reactant delivery system 701 for delivering process gases to a distribution showerhead 706. Reactant delivery system 701 includes a mixing vessel 704 for blending and/or conditioning process gases for delivery to showerhead 706. One or more mixing vessel inlet valves 720 may control introduction of process gases to mixing vessel 704. Similarly, a showerhead inlet valve 705 may control introduction of process gasses to the showerhead 706.

Some metal-containing precursors may be stored in solid or liquid form prior to vaporization and subsequent delivery to the process station. For example, the embodiment of FIG. 7 includes a vaporization point 703 for vaporizing solid reactant to be supplied to mixing vessel 704. In some embodiments, vaporization point 703 may be a heated vaporizer. In some embodiments a flow of an inert gas is passed over the heated solid molybdenum or tungsten precursor, or bubbled through the heated liquid molybdenum or tungsten precursor, under subatmospheric pressure, and carries the precursor vapor to the process chamber. The precursor vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 703 may be heat traced. In some examples, mixing vessel 704 may also be heat traced. In one non-limiting example, piping downstream of vaporization point 703 has an increasing temperature profile extending from approximately 100° C. to approximately 200° C. at mixing vessel 704.

Showerhead 706 distributes process gases toward substrate 712, In the embodiment shown in FIG. 7, substrate 712 is located beneath showerhead 706, and is shown resting on a pedestal 708. It will be appreciated that showerhead 706 may have any suitable shape, and may have any suitable number and arrangement of ports for distributing processes gases to substrate 712. While not explicitly shown, in some embodiments the showerhead 706 is a dual plenum showerhead that includes at least two types of conduits, where the first type of conduit is dedicated to delivery of molybdenum-containing or tungsten-containing precursor vapor, and the second type of conduit is dedicated to delivery of the reactant (e.g., $H_2$, $NH_3$, etc.). In these embodiments the molybdenum-containing precursor and the reactant are not allowed to mix in the conduits prior to entry to the process chamber, and do not share the conduits if delivered to the chamber consecutively.

In some embodiments, a microvolume 707 is located beneath showerhead 706. Performing an ALD and/or CVD process in a microvolume rather than in the entire volume of a process station may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters. This microvolume also impacts productivity throughput. While deposition rate per cycle drops, the cycle time also simultaneously reduces. In certain cases, the effect of the latter is dramatic enough to improve overall throughput of the module for a given target thickness of film.

In some embodiments, pedestal 708 may be raised or lowered to expose substrate 712 to microvolume 707 and/or to vary a volume of microvolume 707. For example, in a substrate transfer phase, pedestal 708 may be lowered to allow substrate 712 to be loaded onto pedestal 708. During a deposition process phase, pedestal 708 may be raised to position substrate 712 within microvolume 707. In some embodiments, microvolume 707 may completely enclose substrate 712 as well as a portion of pedestal 708 to create a region of high flow impedance during a deposition process.

Optionally, pedestal 708 may be lowered and/or raised during portions the deposition process to modulate process pressure, reactant concentration, etc., within microvolume 707. In one scenario where process chamber body 702 remains at a base pressure during the deposition process, lowering pedestal 708 may allow microvolume 707 to be evacuated. Example ratios of microvolume to process chamber volume include, but are not limited to, volume ratios between 1:700 and 1:10. It will be appreciated that, in some embodiments, pedestal height may be adjusted programmatically by a suitable computer controller.

While the example microvolume variations described herein refer to a height-adjustable pedestal, it will be appreciated that, in some embodiments, a position of showerhead 706 may be adjusted relative to pedestal 708 to vary a volume of microvolume 707. Further, it will be appreciated that a vertical position of pedestal 708 and/or showerhead 706 may be varied by any suitable mechanism within the scope of the present disclosure. In some embodiments, pedestal 708 may include a rotational axis for rotating an orientation of substrate 712. It will be appreciated that, in some embodiments, one or more of these example adjustments may be performed programmatically by one or more suitable computer controllers.

Returning to the embodiment shown in FIG. 7, showerhead 706 and pedestal 708 electrically communicate with RF power supply 714 and matching network 716 for powering a plasma. In other embodiments apparatuses without a plasma generator are used for depositing molybdenum-containing and tungsten-containing films using provided methods. In some embodiments, the plasma energy may be controlled by controlling one or more of a process station pressure, a gas concentration, a radio frequency (RF) source power, an RF source frequency, and a plasma power pulse timing. For example, RF power supply 714 and matching network 716 may be operated at any suitable power to form a plasma having a desired composition of radical species. Likewise, RF power supply 714 may provide RF power of any suitable frequency. In some embodiments, RF power supply 714 may be configured to control high- and low-frequency RF power sources independently of one another. Example low-frequency RF frequencies may include, but are not limited to, frequencies between 50 kHz and 700 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas. In some embodiments the plasma is used for post-treatment of deposited substantially carbon-free films.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma process phase may be included in a corresponding plasma activation recipe phase of a deposition process recipe. In some cases, process recipe phases may be sequentially arranged, so that all instructions for a deposition process phase are executed concurrently with that process phase. In some embodiments, instructions for setting one or more plasma parameters may be included in a recipe phase preceding a plasma process phase. For example, a first recipe phase may include instructions for setting a flow rate of an inert and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some embodiments, pedestal 708 may be temperature controlled via heater 710. Further, in some embodiments, pressure control for deposition process station 700 may be provided by butterfly valve 718. As shown in the embodiment of FIG. 7, butterfly valve 718 throttles a vacuum provided by a downstream vacuum pump (not shown). However, in some embodiments, pressure control of process station 700 may also be adjusted by varying a flow rate of one or more gases introduced to process station 700.

Figure 8:
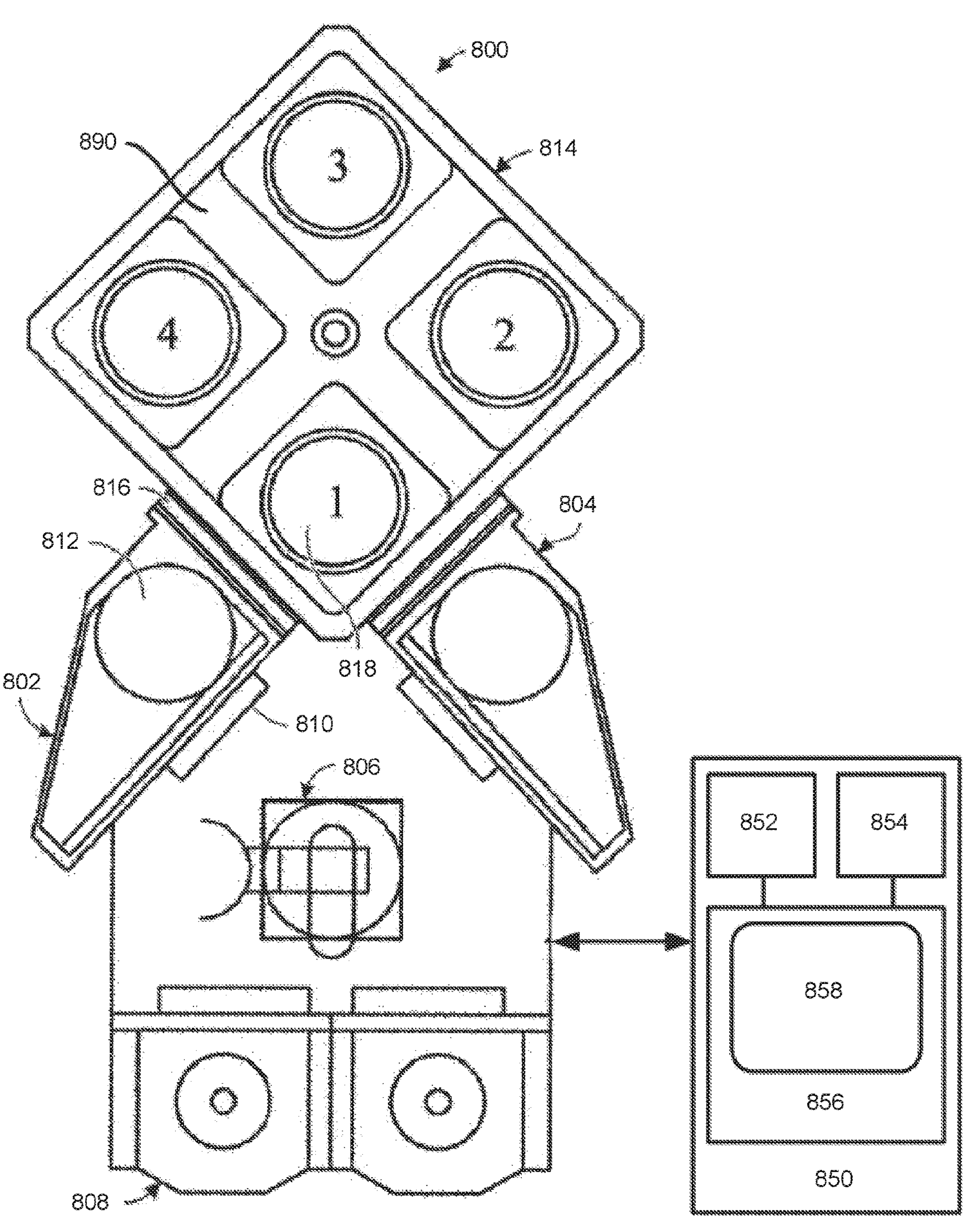
FIG. 8 shows a schematic view of a multi-station processing system according to an embodiment provided herein.

FIG. 8 shows a schematic view of an embodiment of a multi-station processing tool 800 with an inbound load lock 802 and an outbound load lock 804, either or both of which may comprise a remote plasma source. Such tool may be used for processing the substrates using the methods provided herein. A robot 806, at atmospheric pressure, is configured to move wafers from a cassette loaded through a pod 808 into inbound load lock 802 via an atmospheric port 810. A wafer is placed by the robot 806 on a pedestal 812 in the inbound load lock 802, the atmospheric port 810 is closed, and the load lock is pumped down. Where the inbound load lock 802 comprises a remote plasma source, the wafer may be exposed to a remote plasma treatment in the load lock prior to being introduced into a processing chamber 814. Further, the wafer also may be heated in the inbound load lock 802 as well, for example, to remove moisture and adsorbed gases. Next, a chamber transport port 816 to processing chamber 814 is opened, and another robot (not shown) places the wafer into the reactor on a pedestal of a first station shown in the reactor for processing. While the embodiment depicted in FIG. 8 includes load locks, it will be appreciated that, in some embodiments, direct entry of a wafer into a process station may be provided.

The depicted processing chamber 814 comprises four process stations, numbered from 1 to 4 in the embodiment shown in FIG. 8. Each station has a heated pedestal (shown at 818 for station 1), and gas line inlets. It will be appreciated that in some embodiments, each process station may have different or multiple purposes. While the depicted processing chamber 814 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 8 also depicts an embodiment of a wafer handling system 890 for transferring wafers within processing chamber 814. In some embodiments, wafer handling system 890 may transfer wafers between various process stations and/or between a process station and a load lock. It will be appreciated that any suitable wafer handling system may be employed. Non-limiting examples include wafer carousels and wafer handling robots. FIG. 8 also depicts an embodiment of a system controller 850 employed to control process conditions and hardware states of process tool 800. System controller 850 may include one or more memory devices 856, one or more mass storage devices 854, and one or more processors 852. Processor 852 may include a CPU or computer, analog and/or digital input/output connections, stepper motor controller boards, etc.

In some embodiments, system controller 850 controls all of the activities of process tool 800. System controller 850 executes system control software 858 stored in mass storage device 854, loaded into memory device 856, and executed on processor 852. System control software 858 may include instructions for controlling the timing, mixture of gases, chamber and/or station pressure, chamber and/or station temperature, purge conditions and timing, wafer temperature; RF power levels, RF frequencies, substrate, pedestal, chuck and/or susceptor position, and other parameters of a particular process performed by process tool 800. System control software 858 may be configured in any suitable way. For example; various process tool component subroutines or control objects may be written to control operation of the process tool components necessary to carry out various process tool processes in accordance with the disclosed methods. System control software 858 may be coded in any suitable computer readable programming language.

In some embodiments, system control software 858 may include input/output control (IOC) sequencing instructions for controlling the various parameters described above. For example, each phase of an ALD process may include one or more instructions for execution by system controller 850. The instructions for setting process conditions for an ALD process phase may be included in a corresponding ALD recipe phase. In some embodiments, the ALD recipe phases may be sequentially arranged, so that all instructions for a ALD process phase are executed concurrently with that process phase.

Other computer software and/or programs stored on mass storage device 854 and/or memory device 856 associated with system controller 850 may be employed in some embodiments. Examples of programs or sections of programs for this purpose include a substrate positioning program, a process gas control program, a pressure control program; a heater control program, and a plasma control program.

A substrate positioning program may include program code for process tool components that are used to load the substrate onto pedestal 818 and to control the spacing between the substrate and other parts of process tool 800.

A process gas control program may include code for controlling gas composition and flow rates and optionally for flowing gas into one or more process stations prior to deposition in order to stabilize the pressure in the process station. The process gas control program may include code for controlling gas composition and flow rates within any of the disclosed ranges. A pressure control program may include code for controlling the pressure in the process station by regulating, for example, a throttle valve in the exhaust system of the process station, a gas flow into the process station, etc. The pressure control program may include code for maintaining the pressure in the process station within any of the disclosed pressure ranges.

A heater control program may include code for controlling the current to a heating unit that is used to heat the substrate. Alternatively, the heater control program may control delivery of a heat transfer gas (such as helium) to the substrate. The heater control program may include instructions to maintain the temperature of the substrate within any of the disclosed ranges.

A plasma control program may include code for setting RF power levels and frequencies applied to the process electrodes in one or more process stations, for example using any of the RF power levels disclosed herein. The plasma control program may also include code for controlling the duration of each plasma exposure.

In some embodiments, there may be a user interface associated with system controller 850. The user interface may include a display screen, graphical software displays of the apparatus and/or process conditions, and user input devices such as pointing devices, keyboards, touch screens, microphones, etc.

In some embodiments, parameters adjusted by system controller 850 may relate to process conditions. Non-limiting examples include process gas composition and flow rates, temperature, pressure, plasma conditions (such as RF power levels, frequency, and exposure time), etc. These parameters may be provided to the user in the form of a recipe, which may be entered utilizing the user interface.

Signals for monitoring the process may be provided by analog and/or digital input connections of system controller 850 from various process tool sensors. The signals for controlling the process may be output on the analog and digital output connections of process tool 800. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

Any suitable chamber may be used to implement the disclosed embodiments. Example deposition apparatuses include, but are not limited to, apparatus from the Altus® product family, available from Lam Research Corp., of Fremont, Calif., or any of a variety of other commercially available processing systems. Two or more of the stations may perform the same functions. Similarly, two or more stations may perform different functions. Each station can be designed/configured to perform a particular function/method as desired.

In some embodiments, the apparatus includes a process chamber for deposition of substantially carbon-free films, and a different process chamber configured for treating these films with a remote plasma to densify the films, to decrease the resistivity of the films or to increase their work function. In some embodiments the apparatus is programmed or configured to transfer the substrate from a deposition process chamber to a plasma treatment process chamber without exposing the substrate to an ambient atmosphere, moisture or oxygen.

Figure 9:
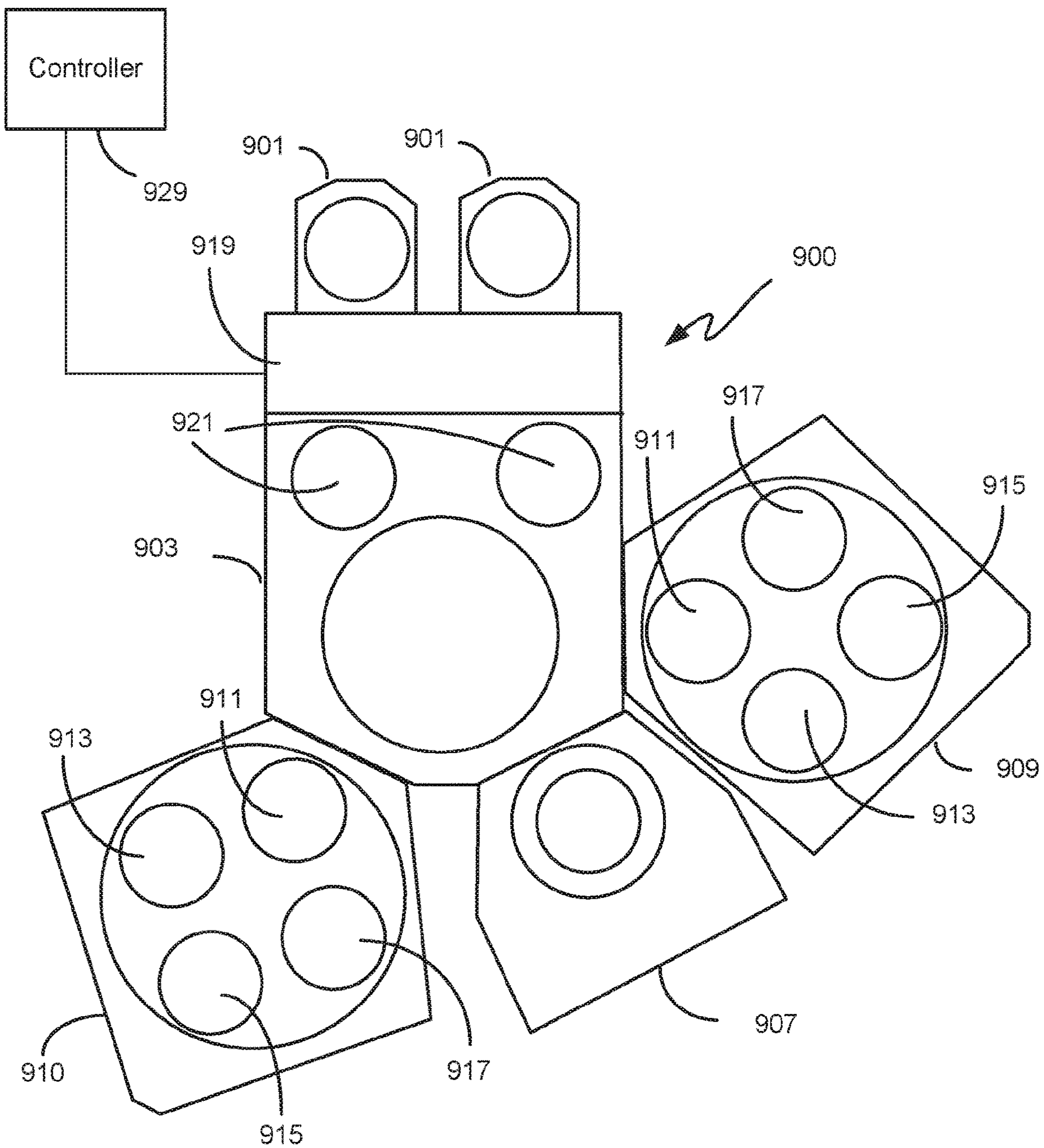
FIG. 9 shows a schematic view of a multi-station processing system according to an embodiment provided herein.

FIG. 9 is a block diagram of a processing system suitable for conducting thin film deposition processes in accordance with certain embodiments. The system 900 includes a transfer module 903. The transfer module 903 provides a clean, pressurized environment to minimize risk of contamination of substrates being processed as they are moved between various reactor modules. Mounted on the transfer module 903 are two multi-station reactors 909 and 910, each capable of performing atomic layer deposition (ALD) and/or chemical vapor deposition (CVD) according to certain embodiments. Reactors 909 and 910 may include multiple stations 911, 913, 915, and 917 that may sequentially or non-sequentially perform operations in accordance with disclosed embodiments. The stations may include a heated pedestal or substrate support, one or more gas inlets or showerhead or dispersion plate.

Also mounted on the transfer module 903 may be one or more single or multi-station modules 907 capable of performing plasma or chemical (non-plasma) pre-cleans, or any other processes described in relation to the disclosed methods. The module 907 may in some cases be used for various treatments to, for example, prepare a substrate for a deposition process. The module 907 may also be designed/configured to perform various other processes such as etching or polishing. The system 900 also includes one or more wafer source modules 901, where wafers are stored before and after processing. An atmospheric robot (not shown) in the atmospheric transfer chamber 919 may first remove wafers from the source modules 901 to loadlocks 921. A wafer transfer device (generally a robot arm unit) in the transfer module 903 moves the wafers from loadlocks 921 to and among the modules mounted on the transfer module 903.

In various embodiments, a system controller 929 is employed to control process conditions during deposition. The controller 929 will typically include one or more memory devices and one or more processors. A processor may include a CPU or computer, analog and/or digital input/output connections, stepper motor controller boards, etc.

The controller 929 may control all of the activities of the deposition apparatus. The system controller 929 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 929 may be employed in some embodiments.

Typically there will be a user interface associated with the controller 929. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the precursor flows, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface. Signals for monitoring the process may be provided by analog and/or digital input connections of the system controller 929. The signals for controlling the process are output on the analog and digital output connections of the deposition apparatus 900.

The system software may be designed or configured in many different ways. For example, various chamber component subroutines or control objects may be written to control operation of the chamber components necessary to carry out the deposition processes (and other processes, in some cases) in accordance with the disclosed embodiments. Examples of programs or sections of programs for this purpose include substrate positioning code, process gas control code, pressure control code, and heater control code.

In some implementations, a controller 929 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 929, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (AI E) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Flow Mixer

In another aspect, a flow mixer for mixing a carrier gas and a metal-containing precursor prior to delivery to the processing chamber is provided. The described flow mixer is adapted to improve uniformity of delivery of the metal-containing precursor to the showerhead, and can be used for any metal-containing precursors, including, but not limited to molybdenum and tungsten precursors described herein. Examples of Mo-containing precursors for ALD or CVD of molybdenum or molybdenum-containing materials include $MoF_6$, $MoCl_5$, molybdenum dichloride dioxide ($MoO_2Cl_2$), molybdenum tetrachloride oxide ($MoOCl_4$), and molybdenum hexacarbonyl ($Mo(CO)_6$). Other Mo oxyhalides of the formula $Mo_xO_xH_z$ and H is a halogen (fluorine (F), chlorine (Cl), bromine (Br), or iodine (I)) and x, y, and z being any number greater than zero that can form a stable molecule. These include molybdenum tetrafluoride oxide ($MoOF_4$), molybdenum dibromide dioxide ($MoO_2Br_2$), and molybdenum oxyiodides $MoO_2I$ and $Mo_4O_{11}I$. Organo-metallic precursors may also be used with examples including Mo precursors having cyclopentadienyl ligands. Further examples include precursors of the formula $Mo_2L_n$, wherein each L is independently selected from an amidate ligand, an amidinate ligand, and a guanidinate ligand, where n is 2-5. The $Mo_2L_n$ precursor includes a multiple molybdenum-molybdenum bond (such as a double bond or any multiple bond with a bond order of 2-5). Further examples include halide-containing heteroleptic molybdenum compounds (i.e., compounds having different types of ligands). Particular examples of such precursors are compounds that include molybdenum, at least one halide forming a bond with molybdenum, and at least one organic ligand having any of the N, O, and S elements, where an atom of any of these elements forms a bond with molybdenum. Examples of suitable organic ligands that provide nitrogen or oxygen bonding include amidinates, amidates, iminopyrrolidinates, diazadienes, beta-imino amides, alpha-imino alkoxides, beta-amino alkoxides, beta-diketiminates, beta-ketoiminates, beta-diketonates, amines, and pyrazolates. Examples of suitable organic ligands that provide sulfur bonding include thioethers, thiolates, dithiolenes, dithiolates, and $\alpha$-imino thiolenes. These ligands may be substituted or unsubstituted. In some embodiments, these ligands include one or more substituents independently selected from the group consisting of H, alkyl, fluoroalkyl, alkylsilyl, alkylamino, and alkoxy substituents. The organic ligands can be neutral or anionic (e.g., monoanionic or dianionic), and molybdenum can be in a variety of oxidation states, such as +1, +2, +3, +4, +5, and +6.

When metal precursor vapor is delivered to the showerhead, it is typically mixed with a flow of a carrier gas, such as $N_2$, argon, helium, and the like, to provide a desired concentration of the precursor. This mixing is typically performed in a flow mixer; which has an outlet that is connected to the showerhead. It is noted that in many embodiments the metal precursor vapor is delivered to the mixing tube with a first flow of a carrier gas, and is then diluted with a second flow of a carrier gas. For clarity; this more concentrated flow of metal-containing precursor in a carrier gas will be referred to as metal precursor flow and the flow of carrier gas that does not include a precursor will be referred to as a carrier gas flow.

One of the problems that can be encountered during mixing of these flows is non-uniform delivery of the metal precursor to the showerhead. For example, peripheral regions near the edge of the showerhead may receive a flow with a lower concentration of metal precursor than more central portions of the showerhead. This, in turn, may lead to non-uniform distribution of the metal precursor in the processing chamber. A flow mixer that is configured for improving uniformity of mixing of the metal precursor with a carrier gas is provided. In some embodiments, the flow mixer delivers the metal precursor such that the concentration of the metal precursor at all showerhead outlets differs by no more than 2% by volume. In the described implementation, the flow mixer includes: (a) an outer fluidic conduit comprising an inlet for admitting the carrier gas into the outer fluidic conduit, a mixing zone for mixing the carrier gas with the metal-containing precursor and an outlet for removing the carrier gas mixed with the metal-containing precursor from the outer fluidic conduit; (b) an inner fluidic conduit positioned at least partially inside the outer conduit, wherein the inner fluidic conduit comprises an inlet for admitting the metal-containing precursor into the inner fluidic conduit, and an outlet configured to release the metal-containing precursor into the outer fluidic conduit, wherein a distance from the inlet of the inner fluidic conduit to the inlet of the outer fluidic conduit is greater than a distance from the outlet of the inner fluidic conduit to the inlet of the outer fluidic conduit, thereby supporting opposing flows of the carrier gas and of the metal-containing precursor in the flow mixer, wherein the distances refer to distances in a z-direction.

Figure 10:
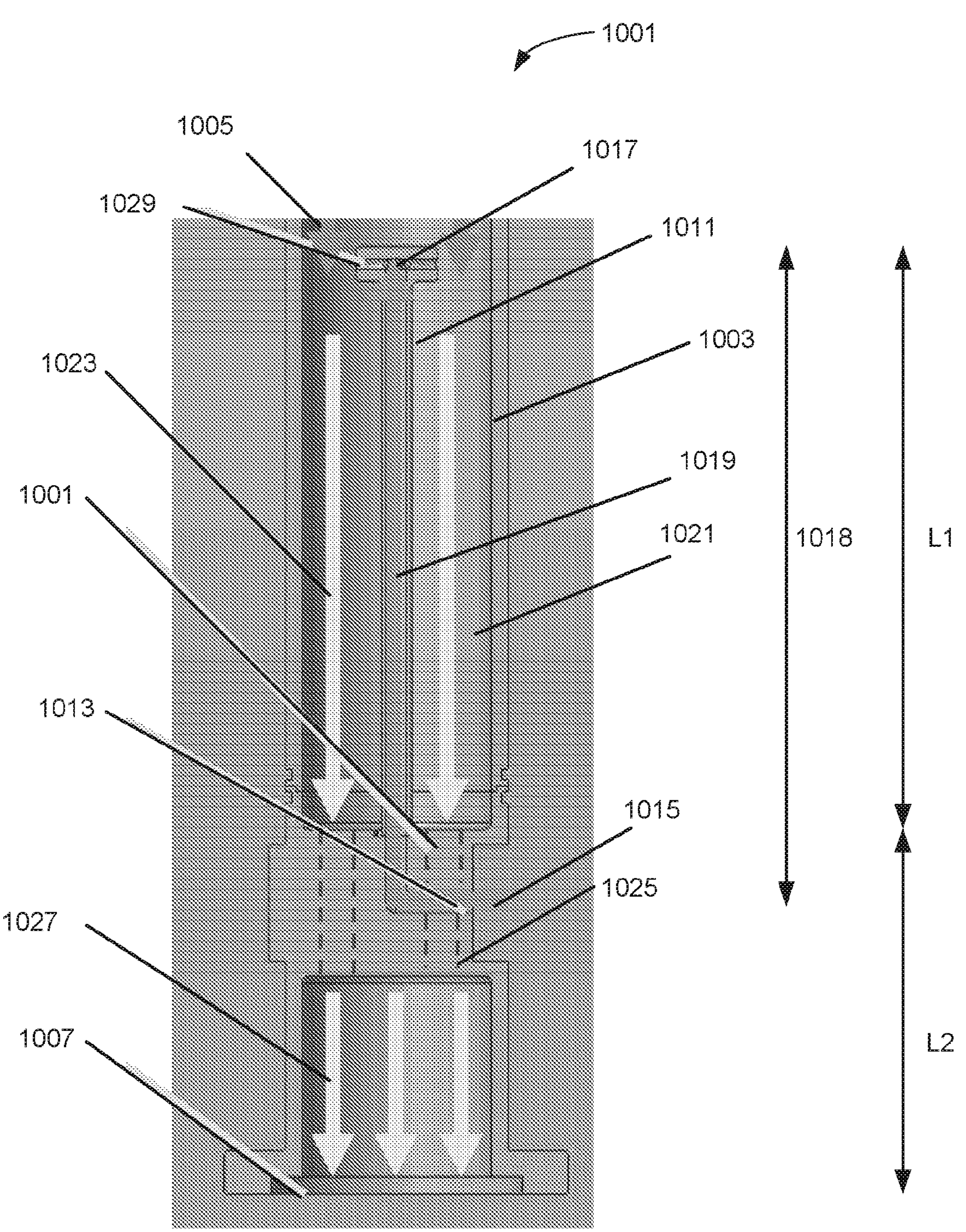
FIG. 10 shows a schematic side view with a cross-sectional insert of a flow mixer in accordance with an embodiment provided herein.

The described flow mixer is illustrated in FIG. 10, which shows a schematic side view of the flow mixer 1001, and a cross-sectional view of a portion that illustrates the inlet of the inner fluidic conduit. Referring to FIG. 10, the outer fluidic conduit 1003 has a generally cylindrical shape, and has an inlet (not shown) for admitting a carrier gas at the top of the outer fluidic conduit 1003. The inlet of the outer fluidic conduit is connected to a source of a carrier gas. The flow of the carrier gas (without the metal precursor) is shown by downward arrows 1005. The outlet 1007 of the outer fluidic conduit 1003 is located opposite to the inlet at the bottom of the outer fluidic conduit 1003. The outlet is adapted to be connected to a showerhead (not shown) and to deliver the flow 1009 of mixed metal-containing precursor with the carrier gas to the showerhead. An inner fluidic conduit 1011 resides inside the outer fluidic conduit (at least partially) and has a portion that is coaxial with the outer fluidic conduit 1003. The inner fluidic conduit 1011 has an inlet 1013 configured to admit the metal precursor from a source of the metal precursor. The metal precursor is typically flowed into the inner fluidic conduit in a mixture with a carrier gas, but this flow has a higher metal precursor concentration than a target concentration for the showerhead, and needs to be further diluted with a carrier gas in the mixing tube. The metal precursor flow entering the inner fluidic conduit 1011 is shown by arrow 1015. The outlet 1017 of the inner fluidic conduit 1011 is configured to release the metal-containing precursor which flows upwards as shown by arrow 1019, into the outer fluidic conduit 1003, where the metal precursor flow is mixed with the carrier gas flow. Notably, the distance 1018 from the inlet 1013 of the inner fluidic conduit 1011 to the outlet 1017 of the inner fluidic conduit 1013 in z-direction (vertical direction) is smaller than the distance from the inlet 1013 of the inner fluidic conduit 1011 to the inlet (not shown) of the outer fluidic conduit 1003 located at the very top of the outer fluidic conduit 1003. This configuration is capable to support opposing flows of the carrier gas (illustrated by downward arrow 1005) and of the metal-containing precursor (illustrated by an upward arrow 1019), which makes the mixing of flows more efficient.

The outer fluidic conduit 1003 has a mixing zone 1021, where the metal-containing precursor and the carrier gas flows are allowed to mix without restrictions forming the mixed flow, illustrated by the downward arrow 1023. It is important to provide a mixing zone of adequate length, as mixing occurring in this zone affects the uniformity of precursor concentration in the showerhead. In some embodiments the length of the mixing zone L1 in the z-direction is at least about 102 mm, such as at least about 127 mm. For example at a flow of 1,000 sccm and an outer diameter of the outer tube of about 41 mm, the 102 mm long mixing zone provides adequate mixing. In some embodiments a ratio of a length L1 of the flow mixing zone in z-direction to an inner diameter of the outer fluidic conduit 1003 is at least about 2, such as at least about 3.

In some embodiments, such as in the embodiment shown in FIG. 10, the outer fluidic conduit 1003 further has a restriction zone 1025, where the mixed flow 1023 is restricted into a plurality of more narrow channels located inside the outer fluidic conduit 1003. For example, in some embodiments the restriction zone contains six more narrow non-communicating channels, which carry the mixed flow to the outlet 1007. The restriction zone has a length L2 (e.g., between about 1-5 mm) in z direction. The mixed flow in the restricted zone is shown by a downward arrow 1027.

In some embodiments, the flow mixer 1001 is designed, such that the outlet 1017 from the inner fluidic conduit 1013 includes a flow diverter 1029, configured to divert flow of the metal-containing precursor before the metal-containing precursor flow mixes with the carrier gas flow in the outer fluidic conduit 1003, such that the diverted flow of the metal-containing precursor retains a velocity component opposing the velocity direction of the carrier gas flow in the outer fluidic conduit.

The flow diverter may include two parallel flow restrictor plates, configured to restrict the flow of the metal-containing precursor between the plates. For example, the upward flow of the metal-containing precursor my be diverted in a lateral direction making a less than a 90 degree turn, thereby retaining a velocity component that opposes the downward direction of the carrier gas flow. Retaining this opposing velocity component is an important factor for improving efficiency of mixing. In some embodiments the flow diverter 1029 includes a delivery tee with a plurality (e.g. six) evenly spaced radial openings.

In some implementations, a ratio of an inner diameter of the outer fluidic conduit to an inner diameter of the inner fluidic conduit is between about 1.5-10, such as between about 1.5-5. In a specific example, an inner diameter of the outer fluidic conduit is about 40.5 mm, and an inner diameter of the inner fluidic conduit is about 4.8 mm. In some implementations, the flow mixer has a total length in z-direction of between about 76-510 mm, such as between about 102-508 mm, such as about 124.5 m. The flow mixer can be made from a variety of materials that are compatible with the metal-containing precursors, including aluminum, stainless steel, and ceramic.

Multi-Plenum Showerhead

In another aspect, a multi-plenum showerhead for delivery of a plurality of reactants to a processing chamber, is provided. The showerhead may be used for delivery of any combination of reactants, including but not limited to molybdenum-containing and tungsten-containing precursors described herein. In some embodiments, the multi-plenum showerhead includes (a) a showerhead faceplate having a first plurality of conduits for delivery of a first reactant and a second plurality of conduits for delivery of a second reactant, wherein the first plurality of conduits is configured to be fluidically isolated from the second plurality of conduits; and (b) a showerhead housing positioned about the perimeter of the showerhead faceplate, wherein the showerhead faceplate is releasably attached to the showerhead faceplate. Because the showerhead is configured to have a removable faceplate, cleaning of the faceplate, which typically contains very small channels, can be performed with high efficiency. For example, the faceplate may be cleaned with the solvent, e.g, by immersion of the faceplate into the solvent and/or purging of channels with a solvent. In some embodiments the faceplate includes openings with a diameter of about 1 mm or less, such as 0.5 mm or less, that can be efficiently cleaned after the faceplate is removed from the base.

Figure 11A:
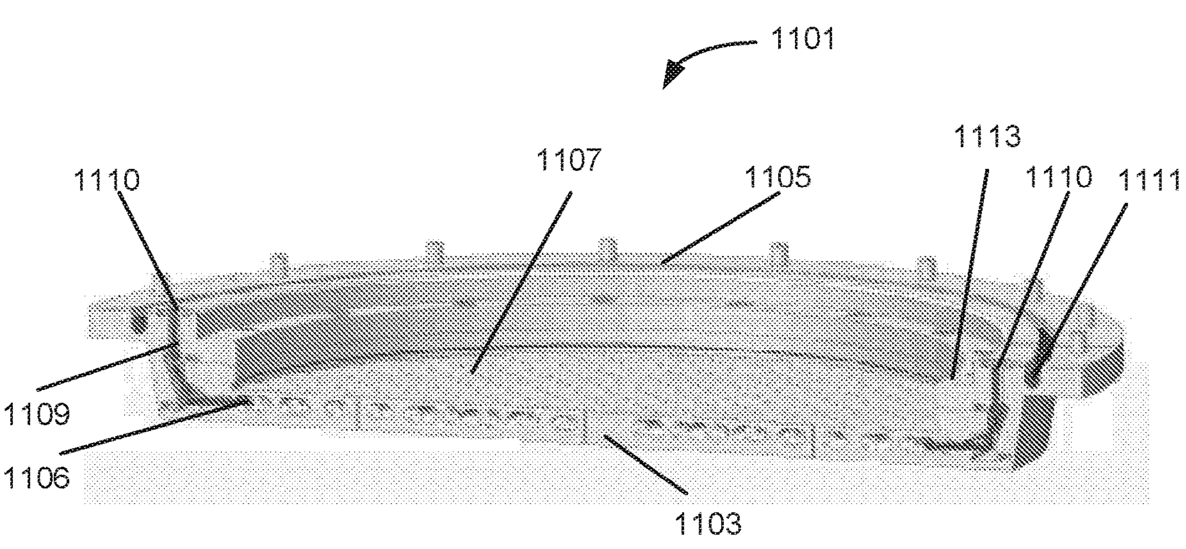
FIG. 11A shows a view of a portion of a dual-plenum showerhead assembly according to an embodiment provided herein.

In some embodiments, the multi-plenum showerhead is a dual-plenum showerhead, where the first plurality of conduits is configured for delivery of a reactant $H_2$, $NH_3$, $SiH_4$, $B_2H_6$, a hydrocarbon etc.) and the second plurality of conduits is configured for delivery of a metal-containing precursor (e.g., a molybdenum-containing or tungsten-containing precursor). FIG. 11A shows a view of a portion of a dual-plenum showerhead 1101, which includes a faceplate 1103 and a housing 1105 attached to the faceplate 1103, where the housing 1105 is positioned about the perimeter of the faceplate 1103. The top portion of the faceplate 1103 contains a large number of openings of conduits 1107, configured to deliver a metal-containing precursor through the faceplate. The metal-containing precursor is delivered downward onto the faceplate, and is restricted by the showerhead housing on the sides. The faceplate 1103 also contains a plurality of fluidic conduits 1106, where fluidic conduits 1106 do not fluidically communicate with the metal precursor conduits 1107. The conduits 1106 are configured to receive a reactant (e.g., $H_2$, $NH_3$, etc.) from a reactant delivery annulus 1109 located in the housing 1105, and to laterally distribute the reactant through the showerhead faceplate 1103, The reactant conduits 1106 have a plurality of outlets on the bottom of the faceplate 1103 (not shown) configured for delivering the reactant to the processing chamber. These outlets, in some embodiments have diameters of about 1 mm or less or 0.5 mm or less. The outlets of both metal precursor conduits and reactant conduits open into the processing chamber. The conduits are designed such that the metal precursor and the reactant do not come into contact with each other in the body of the showerhead 1101.

Figure 11B:
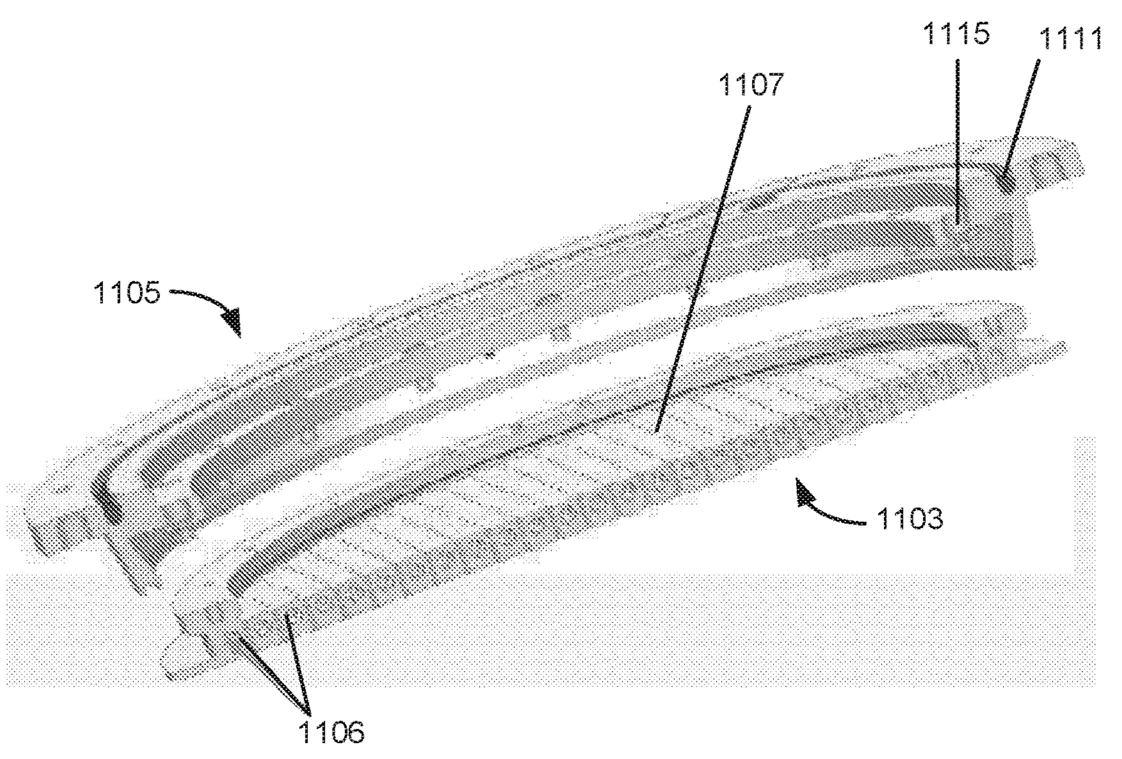
FIG. 11B shows a view of a portion of a showerhead faceplate detached from the showerhead housing according to an embodiment provided herein.

While the showerhead faceplate 1103 serves to distribute and deliver the metal precursor and the reactant to the processing chamber without mixing them, the showerhead housing 1105 serves to confine a volume above the showerhead faceplate 1103 for the metal precursor, and to house a delivery annulus 1109 configured for delivery of the reactant to the reactant conduits 1106 of the showerhead faceplate 1103. The flow of the reactant through is shown by arrows 1110. The housing can further include a heater 1111, which may be annularly shaped, and embedded into a depression formed in the housing. The housing also typically includes a ledge 1113 for supporting an O-ring or another seal for sealing the showerhead to the metal precursor delivery line. FIG. 11B shows a portion of the showerhead faceplate 1103 and of the showerhead housing 1105 after the faceplate 1103 has been released from the housing 1105 (e.g., for cleaning), This view illustrates removable fasteners 1115 which are fitted into the openings in the housing 1105, and are configured to releasably attach the housing 1105 to the faceplate 1103 using openings about a perimeter of the faceplate 1103.

The showerhead faceplate can be manufactured from any materials that are compatible with metal-containing precursors, such as aluminum, stainless steel and ceramic materials.

FURTHER IMPLEMENTATIONS

The apparatus and processes described herein may be used in conjunction with lithographic patterning tools or processes, for example, for the fabrication or manufacture of semiconductor devices, displays, LEDs, photovoltaic panels, and the like. Typically, though not necessarily, such apparatus and processes will be used or conducted together in a common fabrication facility. Lithographic patterning of a film typically comprises some or all of the following steps, each step enabled with a number of possible tools: (1) application of photoresist on a work piece, i.e., a substrate, using a spin-on or spray-on tool; (2) curing of photoresist using a hot plate or furnace or UV curing tool; (3) exposing the photoresist to visible or UV, or eUV or x-ray light with a tool such as a wafer stepper; (4) developing the resist so as to selectively remove resist and thereby pattern it using a tool such as a wet bench; (5) transferring the resist pattern into an underlying film or work piece by using a dry or plasma-assisted etching tool; and (6) removing the resist using a tool such as an RF or microwave plasma resist stripper.

What is claimed is:

1. A method of forming a substantially carbon-free metal-containing layer on a semiconductor substrate, the method comprising:

(a) introducing a metal-containing precursor into a processing chamber housing the semiconductor substrate, wherein the metal-containing precursor is a halide-free, carbonyl-free compound that comprises at least one ligand, bound to a metal selected from the group consisting of molybdenum and tungsten, wherein the halide-free, carbonyl-free compound does not include metal-carbon bonds and metal-oxygen double bonds; and (b) reacting the metal-containing precursor with at least one reactant in an absence of plasma to form a metal-containing layer on the semiconductor substrate, wherein the formed metal-containing layer is a substantially carbon-free molybdenum-containing or tungsten-containing layer that has a carbon content of less than about 5 atomic %, wherein the layer is selected from the group consisting of Mo, W, MON, WN, MOON, WON, MOB, WB, MoSi, WSi layer and combinations thereof.

2. The method of claim 1, wherein the formed metal-containing layer has a carbon content of less than about 2 atomic %.

3. The method of claim 1, wherein the metal-containing precursor does not include beta-hydrogen atoms.

4. The method of claim 1, wherein the formed metal-containing layer is selected from the group consisting of Mo, MON, and MOON.

5. The method of claim 1, wherein the metal-containing precursor is selected from the group consisting of precursors 1-16, wherein each R and RI is independently selected from the group consisting of an alkyl, fluoroalkyl, and alkylsilyl, wherein R does not include beta hydrogen bonds, n is 1-4 and m is 1-4.

6. The method of claim 1, wherein the metal-containing precursor is a compound selected from compounds 17-20.

7. The method of claim 1, further comprising:

(c) treating the formed metal-containing layer with a nitrogen-containing reactant and increasing nitrogen content in the metal-containing layer.

8. The method of claim 7, wherein the treated metal-containing layer is a MON layer having a work function of greater than about 4.9 eV.

9. The method of claim 1, further comprising:

(c) densifying the formed metal-containing layer by treating the metal-containing layer with a plasma formed in a process gas comprising $H_2$.

10. The method of claim 1, wherein in (b) the reaction between the metal-containing precursor and the at least one reactant occurs on the surface of the semiconductor substrate.

11. The method of claim 1, wherein the substantially carbon-free metal-containing layer is a diffusion barrier layer or a liner layer.

12. The method of claim 1, wherein the method comprises forming the substantially carbon-free metal-containing layer having a work function of greater than about 5.0 eV in a pMOS device.

13. The method of claim 1, wherein forming the substantially carbon-free metal layer having a work function of greater than about 5.0 eV, comprises treating the semiconductor substrate after (b) with a plasma-activated nitrogen-containing reactant, to increase nitrogen content in the metal-containing layer.

14. The method of claim 1, wherein the substantially carbon-free metal layer is formed in (b) at a temperature of less than about 450° C.

* * * * *